US011469723B2

(12) United States Patent
Terwal et al.

(10) Patent No.: US 11,469,723 B2
(45) Date of Patent: Oct. 11, 2022

(54) SELF-BOOSTING AMPLIFIER

(71) Applicant: Bose Corporation, Framingham, MA (US)

(72) Inventors: Remco Terwal, West Newton, MA (US); Thomas Powell, Waltham, MA (US)

(73) Assignee: Bose Corporation, Framingham, MA (US)

( * ) Notice: Subject to any disclaimer, the term of this patent is extended or adjusted under 35 U.S.C. 154(b) by 547 days.

(21) Appl. No.: 16/507,890

(22) Filed: Jul. 10, 2019

(65) Prior Publication Data
US 2020/0021256 A1    Jan. 16, 2020

Related U.S. Application Data

(60) Provisional application No. 62/695,950, filed on Jul. 10, 2018.

(51) Int. Cl.
*H03F 3/181*    (2006.01)
*H04R 3/00*    (2006.01)
(Continued)

(52) U.S. Cl.
CPC .......... *H03F 3/2173* (2013.01); *H02M 1/083* (2013.01); *H02M 3/1582* (2013.01); *H03F 3/181* (2013.01); *H03F 3/265* (2013.01); *H04R 3/00* (2013.01); *H03F 2200/03* (2013.01)

(58) Field of Classification Search
CPC .. H02M 1/0058; H02M 1/0077; H02M 1/083; H02M 3/005; H02M 3/157; H02M 3/158; H02M 3/1582; H02M 3/1586; H03F 2200/03; H03F 3/181; H03F 3/185; H03F 3/2173; H03F 3/265; H04R 3/00; Y02B 70/10
(Continued)

(56) References Cited

U.S. PATENT DOCUMENTS 4,186,437 A     1/1980   Cuk
5,418,704 A  *  5/1995   Hua ..................... H02M 3/158
                                                    323/282
(Continued)

FOREIGN PATENT DOCUMENTS

WO    WO 2004/006037    1/2004
WO    WO 2017/141025    8/2017

OTHER PUBLICATIONS

Texas Instruments: Designing DC/DC converters based on ZETA topology by Jeff Falin, 2010 (Year: 2010).*
(Continued)

*Primary Examiner* — Vivian C Chin
*Assistant Examiner* — Friedrich Fahnert
(74) *Attorney, Agent, or Firm* — Fish & Richardson P.C.

(57) ABSTRACT

The technology described in this document can be embodied in an apparatus that includes an amplifier that includes a first Zeta converter connected to a power supply and a load. The amplifier also includes a second Zeta converter connected to the power supply and the load. The second Zeta converter is driven by a complementary duty cycle relative to the first Zeta converter. The amplifier also includes a controller to provide an audio signal to the first Zeta converter and the second Zeta converter for delivery to the load.

30 Claims, 29 Drawing Sheets

(51) Int. Cl.
*H03F 3/217* (2006.01)
*H02M 1/08* (2006.01)
*H02M 3/158* (2006.01)
*H03F 3/26* (2006.01)

(58) Field of Classification Search
USPC .......................................................... 381/120
See application file for complete search history.

(56) References Cited

U.S. PATENT DOCUMENTS

| 9,882,543 B2* | 1/2018 | Mohammadpour .... H03F 1/565 |
| 2014/0184172 A1* | 7/2014 | Momo .................... B60L 53/12 |
| | | 320/160 |
| 2014/0369529 A1* | 12/2014 | Quinn ................... H03F 3/2171 |
| | | 381/121 |
| 2018/0048228 A1* | 2/2018 | Chen ....................... H02M 1/08 |

OTHER PUBLICATIONS

International Search Report and Written Opinion in Appln. No. PCT/US2019/041227, dated Oct. 4, 2019, 15 pages.
Cuk et al., "A Conceptually New High-Frequency Switched-Mode Power Amplifier Technique Eliminates Current Ripple," InProc. 5th Nat. Solid-State Power Conversion Conf., May 1978, 22 pages.
International Preliminary Report on Patentability in International Appln. No. PCT/US2019/041227, dated Jan. 21, 2021, 8 pages.

* cited by examiner

SELF-BOOSTING AMPLIFIER

CLAIM OF PRIORITY

This application claims priority under 35 USC § 119(e) to U.S. Patent Application Ser. No. 62/695,950 filed on Jul. 10, 2018, the entire contents of which are hereby incorporated by reference.

TECHNICAL FIELD

This disclosure generally relates to self-boosting amplifier techniques.

BACKGROUND

Switching audio amplifiers can be used to drive speakers for sound reproduction. A class-D amplifier is an amplifier in which amplifying components (e.g., a pair of transistors) operate as electronic switches that rapidly switching back and forth between the supply rails to encode an audio input into a pulse train. Once processed to remove the high-frequency pulses (e.g., by a low-pass filter), the audio signal is provided to a loudspeaker. Since the components (e.g., the transistors) never conduct at the same time, there is no other path for current flow apart from the low-pass filter and the loudspeaker. As such, class-D amplifiers provide high power conversion efficiency along with high-quality signal amplification.

SUMMARY

In one aspect, this document describes an apparatus that includes an amplifier that includes a first Zeta converter connected to a power supply and a load. The amplifier also includes a second Zeta converter connected to the power supply and the load. The second Zeta converter is driven by a complementary duty cycle (e.g., 180 degrees out of phase) relative to the first Zeta converter. The amplifier also includes a controller to provide an audio signal to the first Zeta converter and the second Zeta converter for delivery to the load.

Implementations can include one or more of the following features. The controller may be configured to obtain pole and zero locations that result in a stable closed loop response in combination with the Zeta converter circuitry to initiate moving the one or more poles and zeros to positions external to an operating frequency range of the amplifier. The amplifier may be a class-D amplifier. Both the first Zeta converter and the second Zeta converter may be fourth order converters. Both the first Zeta converter and the second Zeta converter may employ a Zero Voltage Transition (ZVT) switching technique. Each of the first Zeta converter and the second Zeta converter may include an inductor directly connected to ground and a switch directly connected to the power supply. The controller may be connected to the load to receive a feedback signal. The feedback signal may be a voltage feedback signal or a current feedback signal. The controller may use the feedback signal to control delivery of the audio to the first Zeta converter and the second Zeta converter. Each of the first Zeta converter and the second Zeta converter may use integrated magnetics to couple inductors. The converter and/or controller may be configured to initiate moving one or more poles and zeros to positions external to the operating frequency range (e.g., an audio frequency band, a control frequency band, etc.) of the amplifier. The load may be at least one speaker.

In another aspect, this document features an amplifier that includes a power stage that includes a first Zeta converter connectable to a power supply and a load. The power stage also includes a second Zeta converter connectable to the power supply and the load. The second Zeta converter being driven by a complementary duty cycle relative to the first Zeta converter. The power stage also includes a controller to provide an audio signal to the first Zeta converter and the second Zeta converter for delivery to the load. The controller is configured to initiate moving the one or more poles and zeros to positions external to an operating frequency range of the amplifier.

Implementations can include one or more of the following features. The controller may be configured to obtain pole and zero locations that result in a stable closed loop response in combination with the Zeta converter circuitry to initiate moving the one or more poles and zeros to positions external to an operating frequency range of the amplifier. The amplifier may be a class-D amplifier. Both the first Zeta converter and the second Zeta converter may be fourth order converters. Each of the first Zeta converter and the second Zeta converter may include an inductor directly connected to ground and a switch directly connected to the power supply. The controller may be connected to the load to receive a feedback signal. The feedback signal may be a voltage feedback signal or a current feedback signal. The controller may use the feedback signal to control delivery of the audio to the first Zeta converter and the second Zeta converter. The controller may use the feedback signal to control delivery of the audio to the first Zeta converter and the second Zeta converter. Each of the first Zeta converter stage and the second Zeta converter stage may use integrated magnetics to couple inductors. The controller may be configured to initiate moving (e.g., cancel) the one or more poles and zeros to positions external to the operating frequency range (e.g., an audio frequency band, a control frequency band, etc.) of the amplifier. Both the first Zeta converter and the second Zeta converter may employ a Zero Voltage Transition (ZVT) switching technique. The load may be at least one speaker. Out-of-phase (AD) modulation or in-phase (BD) modulation can be used. The controller may be configured to further establish feedback stability by adding other poles and zeros to shape the closed loop response. Current feedback may be used in the first and second Zeta converters to synthesize a damping resistance to suppress any natural frequencies in the converters.

Various implementations described herein may provide one or more of the following advantages. Through the presented design, a self-boosting class-D amplifier can function without needing to employ a separate boost converter, share a boost converter, etc. The design allows an amplifier to provide multiple channels with larger dynamic range for each channel. The design can employ digital dynamic compensation to control the amplifier and reduce distortion. The controller may implement strategies to suppress switching losses.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DETAILED DESCRIPTION

Figure 1:
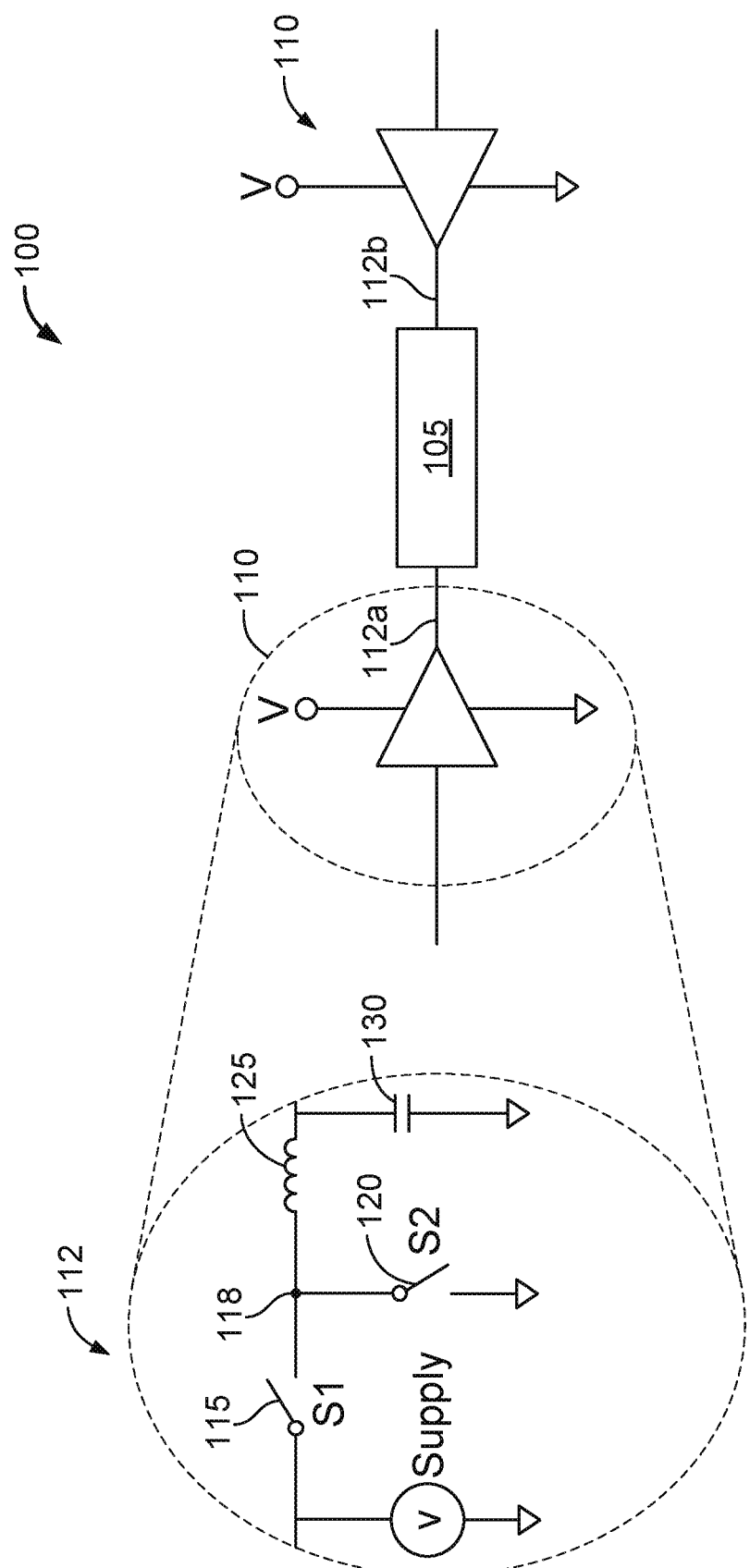
FIG. 1 is a block diagram of a system with an H Bridge and a bridge tied load (BTL).

Increased power conversion efficiency of class-D amplifiers allow for higher current and higher output power into transducers such as audio speakers. When class-D amplifiers are powered from a fixed voltage supply rail, a reduction in transducer impedance facilitates further increments in power output to the transducers when the further power is not achievable with the provided rail voltage and actual transducer impedance. But reducing the transducer impedance can cause losses through connecting wires to become excessive, thereby negating the efficiency benefits of the class-D amplifier itself. An alternative technique can be employed to increase the power delivered to the transducer, for example, supply voltage used by the amplifier may be increased, which would proportionally reduce the magnitude of the current into the transducer. Such an increase in supply voltage may cause increases in losses (due to the switching nature of class-D amplifiers), but this technique is more practical than lowering transducer impedance.

In battery operated environments, such as with portable audio devices, automotive sound applications, etc., providing increased voltage can call for a dedicated voltage step up (e.g. from boost converter, etc.). Such a boost converter supplies power to the amplifier and may need to be employed since available battery voltage is typically lower than the voltage needed to supply the class-D amplifier.

For efficiency (e.g., space and cost savings, etc.), a boost converter can be shared among two or more class-D amplifier power stages. Such a topology can lead to tradeoffs pertaining to the maximum power the boost converter is able to provide, both short term and/or long term. However, some inefficiencies can be introduced through such sharing; for example, only one of the connected amplifiers may require a high output power while the other amplifier(s) remain at a relatively low output level. Channels associated with the lower output amplifier could therefore run with a lower efficiency compared to the one that needs the higher boost voltage. Along with introducing potential inefficiency, the class-D amplifiers should be kept from saturation that can clip output voltage and cause audio distortion along with increasing the probability of damage to the transducer (e.g., speaker) from excess thermal stress. To address potential saturation, voltage compression techniques may be employed to reduce gain when a clipping threshold is approached (e.g., a threshold between 70%-90% of a maximum voltage output level).

Rather than employing a separate device for boosting, a class-D amplifier design provides this functionality and the ability that drives a transducer while increasing dynamic range. Through this design, an amplifier can be achieved that provides multiple channels with high dynamic range for each channel. Further, physical size can generally be maintained (compared to conventional buck derived class-D amplifiers) and the voltage and power output can be optimized for each individual channel without compromising the efficiency of adjacent channels. In one example, a design includes a fourth order DC to DC converter (referred to as a Zeta converter) that is capable of operating in a step-up mode or a step-down mode (a buck-boost capability). The Zeta converter improves dynamic behavior of the power stage of the amplifier. Additionally, the design employs digital compensation to control the amplifier and reduce distortion.

Further, integrated magnetics can be used to reduce circuitry space needs, and relatively high frequency zero voltage transition (ZVT) techniques can be used to reduce switching losses. For example, ZVT techniques described in U.S. Pat. No. 5,418,704 titled "Zero-Voltage-Transition Pulse Width Modulated Converters", which issued 23 May 1995 may be applied, and is incorporated by reference in its entirety. Integrated magnetics can be used not only to couple an input inductor to an output inductor (on the positive and negative sides) but also to cross-couple to each other. For example, integrated magnetics can be employed as described in U.S. Pat. No. 9,882,543, titled "Magnetic Structures for Filtering Amplifier Outputs," filed 7 May 2015, which is incorporated by reference in its entirety. Along with reducing ripple current, magnetic flux ripple is reduced within the magnetic structure, which reduces magnetic losses using smaller sized components while allowing high switching frequencies. Using cross-coupled magnetics imposes a higher common-mode inductance compared to the differential mode inductance, which reduces high frequency emissions (for electromagnetic compatibility (EMC) considerations). The partial coupling between the input and output inductances also allows for the repositioning of open loop small signal transfer function resonances to aid the stabilization of the amplifier. Referring to FIG. 1A, control to output gain and phase (versus frequency) charts 10 and 12 of a Zeta converter are presented for which coupling factor (k) is varies for input and output coils.

By using these design features, a switching class-D push-pull amplifier can be powered by a single constant supply rail relative to ground (e.g., a battery) and produce an output voltage having a single-sided peak voltage above the supply rail relative to ground absent the need to add an external boost power converter. As such, the design provides a self-boosting class-D amplifier that is capable of increasing dynamics and correspondingly deliver higher power to a transducer, and improve sound quality of a sound system, etc. By employing a Zeta converter in the design, the output bias is positive and the appearance of right half plane zeroes can be made absent in the control-to-output transfer function operating frequency range, supply-to-output transfer function, etc. Through this design, small sized amplifiers can be implemented by employing relatively high switching frequencies, which allow for components having low reactive values (e.g., low value inductances for inductors and low value capacitances for capacitors). Using low value reactances, transfer function resonances (conjugate poles) as well as conjugate zeros are moved beyond the upper region of the audio frequency band and a relatively flat gain is provided in the audio band. Using local current feedback techniques, synthesized damping resistances are introduced to reduce the Q of conjugate pole related resonances.

A digital controller should also be employed in the design to assist in the accurate and consistent placement of poles and zeros in a loop controller of the amplifier. The digital controller can also allow for dynamic duty cycle based positioning and repositioning of gain, poles and zeros based on one or more programmed duty cycles. Along with improving stability and dynamics, the use of a digital controller also allows for high-order compensators, thereby allowing for steep magnitude and phase features while providing high closed loop gain without compromising phase margin. The digital controller allows differential mode and common mode aspects of output signals to be separately controlled. In some implementations, feedback is provided by a low latency analog-to-digital converter (ADC) (e.g., a sigma-delta based ADC) and the ADC can take feedback at the output of the amplifier (after output inductors). A digital modulator can be used to drive the power switches of the amplifier to reduce modulator linearity issues. A digital modulator can also be programmed to dynamically control the common mode DC bias at the output to suppress high frequency switching losses by reducing the voltage across the transistors when the differential output levels are relatively low in amplitude.

One or more switching techniques may be employed in the amplifier design; for example, Zero Voltage Transition (ZVT) switching can be used to reduce the switching losses of the amplifier for a larger range of duty cycles. Such techniques allow for high frequency switching with relatively low transistor switching losses and can be realized in a variety of implementations; for example Gallium nitride (GaN) based components, such as field-effect transistors (FETs), may be used in the amplifier. Further, the total resistance between the drain and source in the FETs ("drain-source on resistance, $R_{DS(on)}$) can be very low facilitating the reduction of transistor conduction losses. High output capacitance can be instrumental as a resonant capacitance to achieve ZVT conditions together with small auxiliary circuits consisting of a small resonant coil and switch.

In some implementations, the power converter of the amplifier includes a reduced number of high power switches (e.g., for a small chip die); for example, a maximum of four main high-power FET switches can be used to provide a cost competitive amplifier (e.g., compared to conventional class-D amplifiers).

Figure 1A:
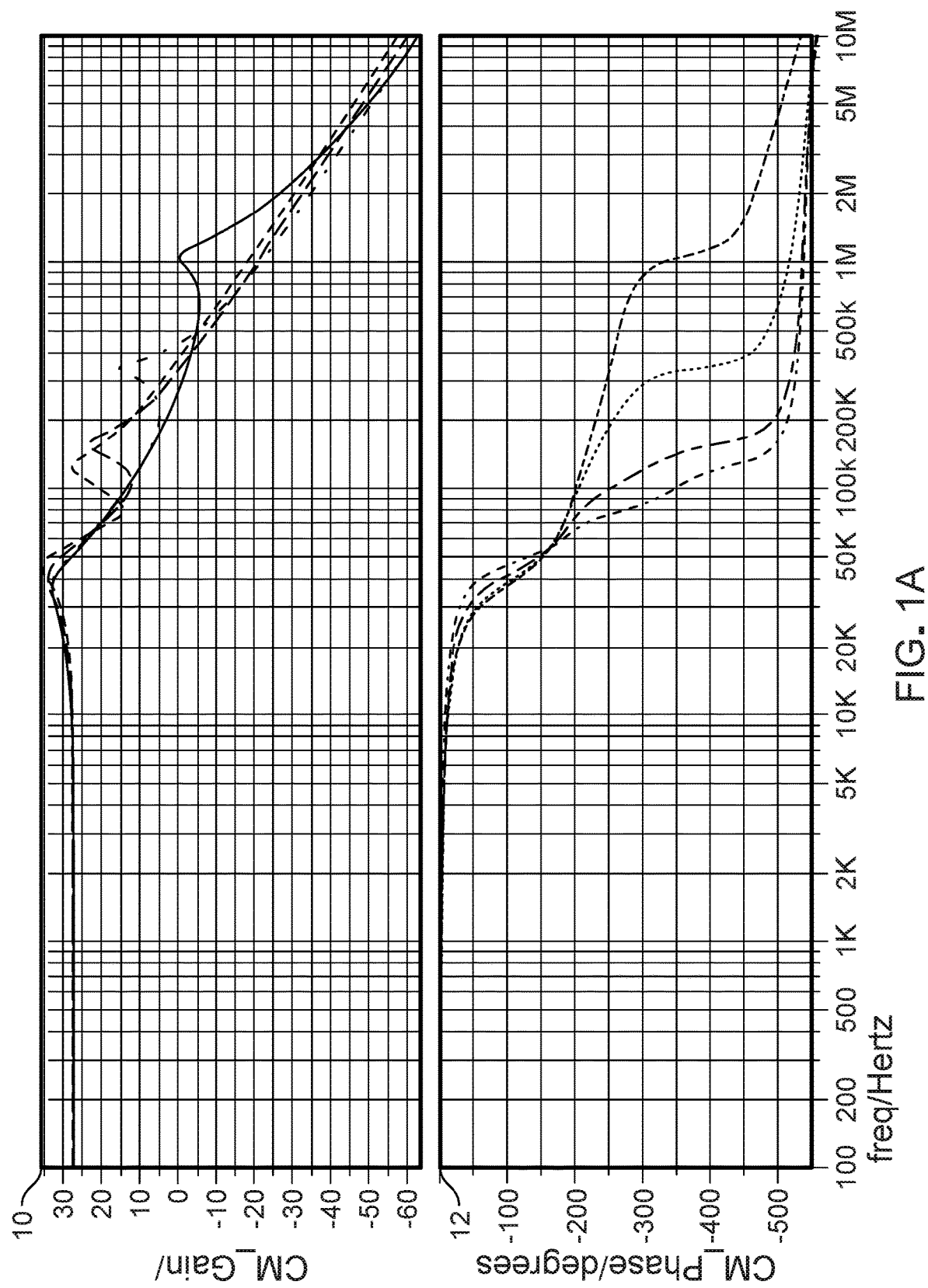
FIG. 1a are control to output magnitude and phase plots for various inductor coupling factors in a Zeta converter.

FIG. 1 shows a block diagram of a system 100 where a load 105 (e.g., a speaker) is driven by class-D amplifiers 110 from both sides. FIG. 1 also shows a detailed view 112 of the amplifier 110; the detailed view 112 showing examples of various components that can be used in implementing the amplifier 110. As shown in the detailed view 112, the amplifier 110 includes two switches 115 and 120 which can be implemented using active devices such as transistors, FETs, etc. The output generated at a node 118 is a variable duty cycle square wave the low-frequency portion of the spectrum of which includes the desired output, and the high-frequency portion of the spectrum of which includes components due to the switching of the power devices.

The output pulse train obtained at node 118 is converted to an analog signal suitable for driving the load 105 via a low pass filter circuit. In some implementations, the low-pass filter circuit is a passive LC circuit that includes one or more inductors 125 and one or more capacitors 130. While FIG. 1 shows the filter circuit as a part of the detailed view 112 for the amplifier 110, in some cases, the filter circuit may be depicted separately from the amplifier 110. In operation, the filter circuit removes or blocks the high-frequency components and recovers the desired low-frequency signal suitable for driving the load 105. Using purely reactive components such as inductors and capacitors results in high efficiency.

The efficiency of switching amplifiers are affected however by switching losses arising out of the switching operations of the active components 115 and 120. The switching operations also give rise to undesirable ripple currents. The ripple currents can also be reduced through the component value choices in the LC filter circuit and the relative switching frequency. Higher switching frequencies generally result in lower ripple currents for a given inductance value, while smaller inductance values result in higher ripple currents for a given switching frequency. Therefore, the overall ripple current can be maintained by going to a higher switching frequency and using smaller inductors. This is desirable because smaller inductance values are typically lower cost and size. However, at higher switching frequencies, the switching losses increase, thereby reducing the efficiency of the circuit. In some implementations, the switching frequency can be selected in view of this trade-off.

In the example shown in the detailed view 112, the structure of the class-D amplifier 110 is essentially identical to that of a buck converter. In some implementations, such buck converters can be used to form class-D amplifiers for driving a fixed load from both sides. In some implementations, four or more synchronous buck converters configured as two or more H bridges may be used for this purpose. Because the output current and voltage of a class D amplifier can independently change signs, multiple modes of operations are possible in the configuration depicted in FIG. 1. For example, the configuration of FIG. 1 may be operated in a common mode (CM) and one or more differential modes (DM). In a DM, the voltage difference between two load terminals 112a and 112b is given by:

$$V_{dm} = V_1 - V_2 \tag{1}$$

wherein $V_1$ and $V_2$ are the output voltages of the amplifiers on the two sides of the load, respectively. The CM voltage is average of the output voltages of two amplifiers, and given by:

$$V_{cm} = \frac{V_1 + V_2}{2} \quad (2)$$

For a bridge tied load (BTL), where load is connected between two switching bridges, different modulation schemes (e.g., AD, BD) can be used to achieve different goals in terms of DM and CM component of output voltage. In some implementations, higher degrees of freedom can be realized using multiple amplifiers on either side of the load. An example of such a configuration is depicted in FIG. 2, which shows a block diagram of a system 200 where a load 105 is driven by multiple amplifiers 110a, 110b, 110c, and 110d (110, in general) from both sides.

Figure 2:
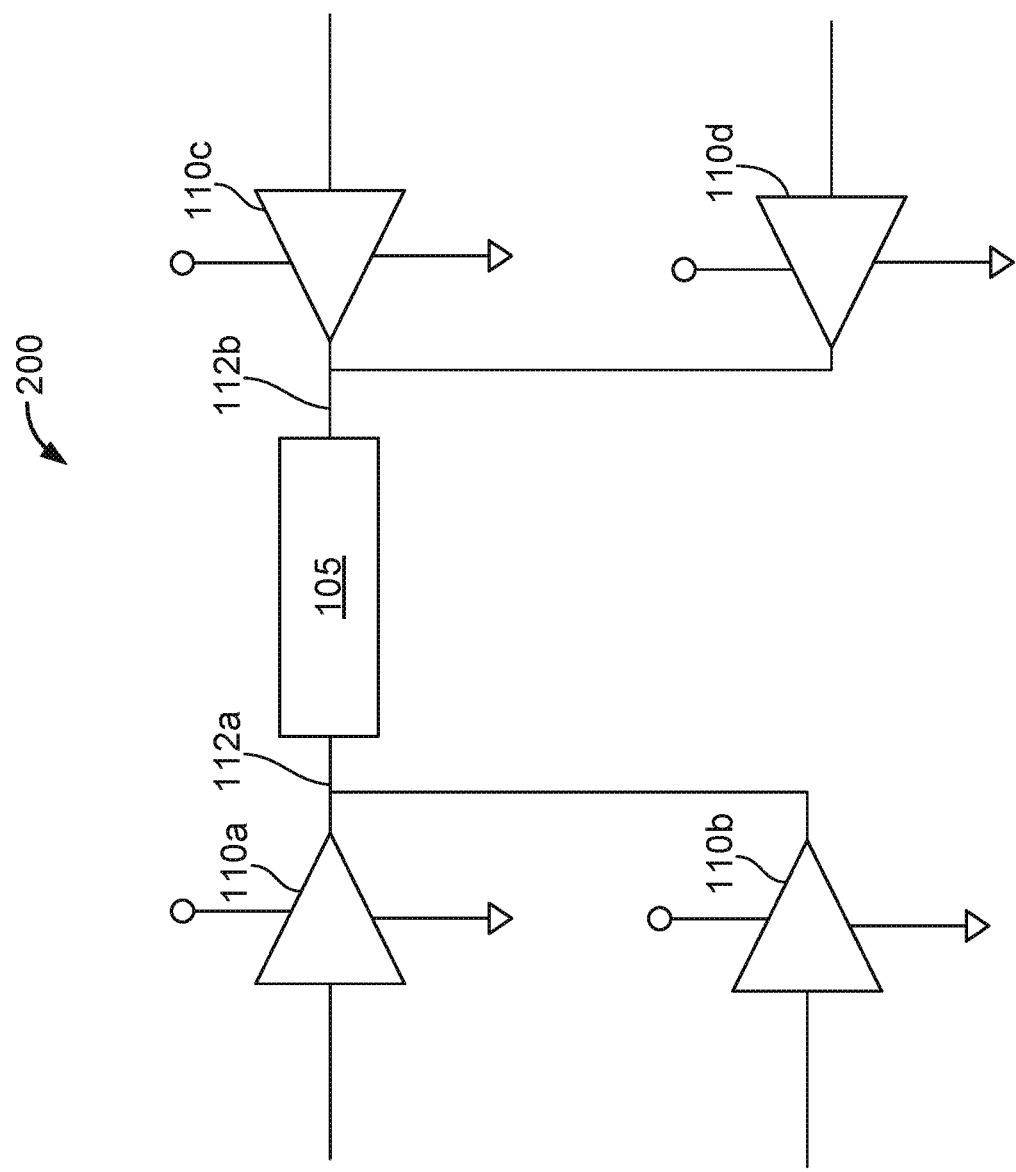
FIG. 2 is a block diagram of a system where a load is driven by multiple H Bridges.
Figure 3:
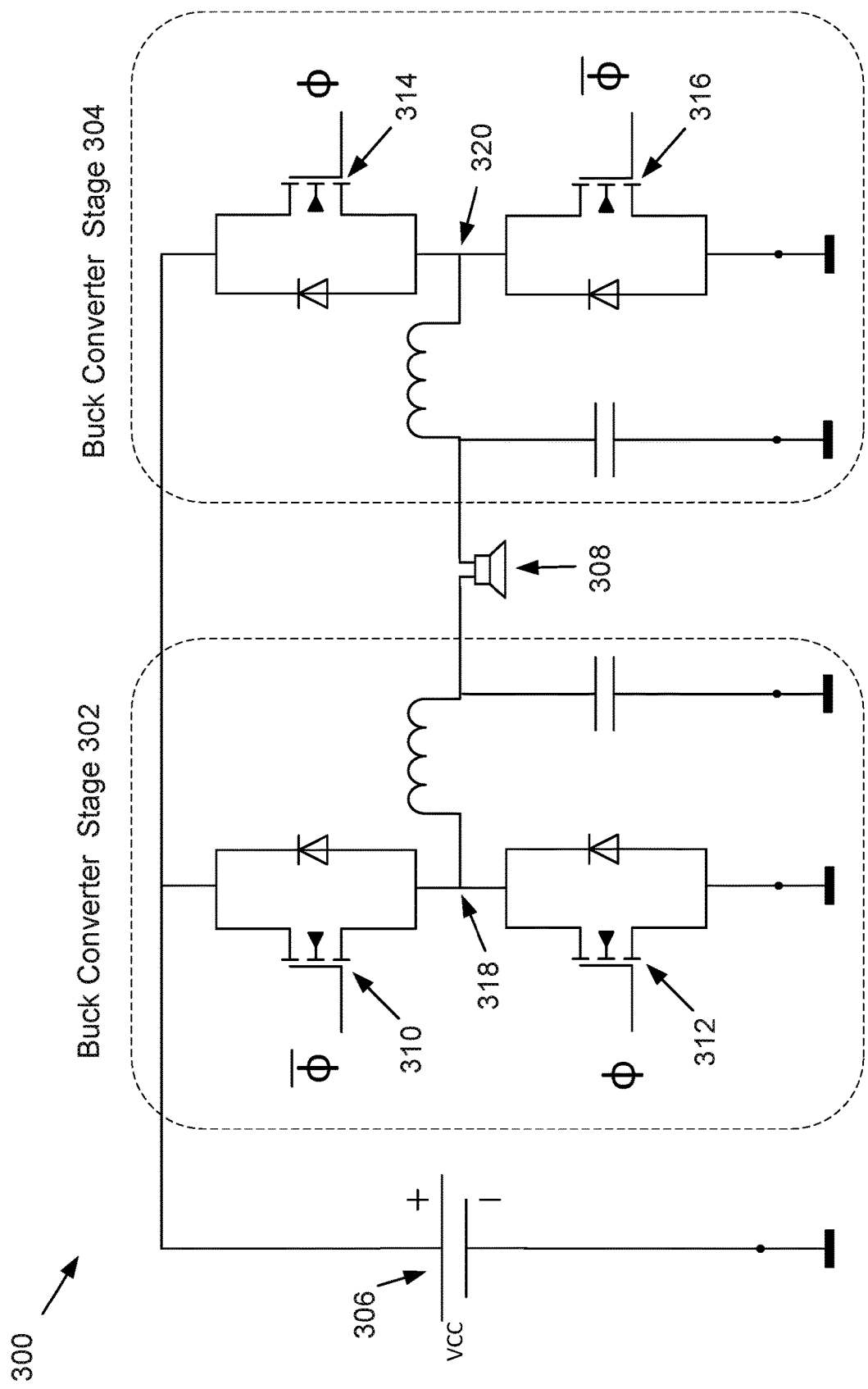
FIG. 3 shows a circuit diagram of a class-D amplifier BTL stage.

FIG. 3 shows a conventional class-D push-pull amplifier 300 that is created through the combination of two regular synchronous buck converter power stages 302, 304 in a push-pull formation (referred to as a class-D H-bridge), which is similar to the BTL stage shown in FIG. 2. Both buck converters 302, 304 share a single power supply 306 referenced to ground. Similar to the load 105 (shown in FIGS. 1 and 2), a load 308 (e.g., a speaker) is connected between the buck stages.

The load 308 is driven through the modulation of switches 310, 312, 314, and 316 (power MOSFETs) of these two power stages 302, 304. When both buck converters 302, 304 are modulated with a 50% switching duty cycle the voltages at nodes 318 and 320 have the same potential, approximately half of the voltage (VCC) provided by power supply 306. This voltage potential is provided since each buck converter 302, 304 has a DC transfer characteristic of V(at node 318)/VCC=D and V(at node 320)/VCC=1-D. Due to these transfer characteristics, no current flows through the load due to the zero differential voltage. When buck converter 302 is modulated with a duty cycle different from 50% (e.g., 75%), the voltage at node 318 increases to 75% of VCC (again, being provided by power supply 306). Due to the inverted phasing of the gates of buck converter 304 relative to buck converter 302, the duty cycle of buck converter 304 is 25%. As such, the voltage at node 320 is 25% of VCC (from the power supply 306). The voltage at node 318 being higher than node 320, current flows through the load from node 318 to node 320. Similarly, for a duty cycle less than 50%, the current flows from node 320 to node 318 thereby providing an opposite differential load voltage polarity and the opposite direction of current flow. As such, the amplifier 300 produces positive and negative polarities across the load 308.

Figure 4:
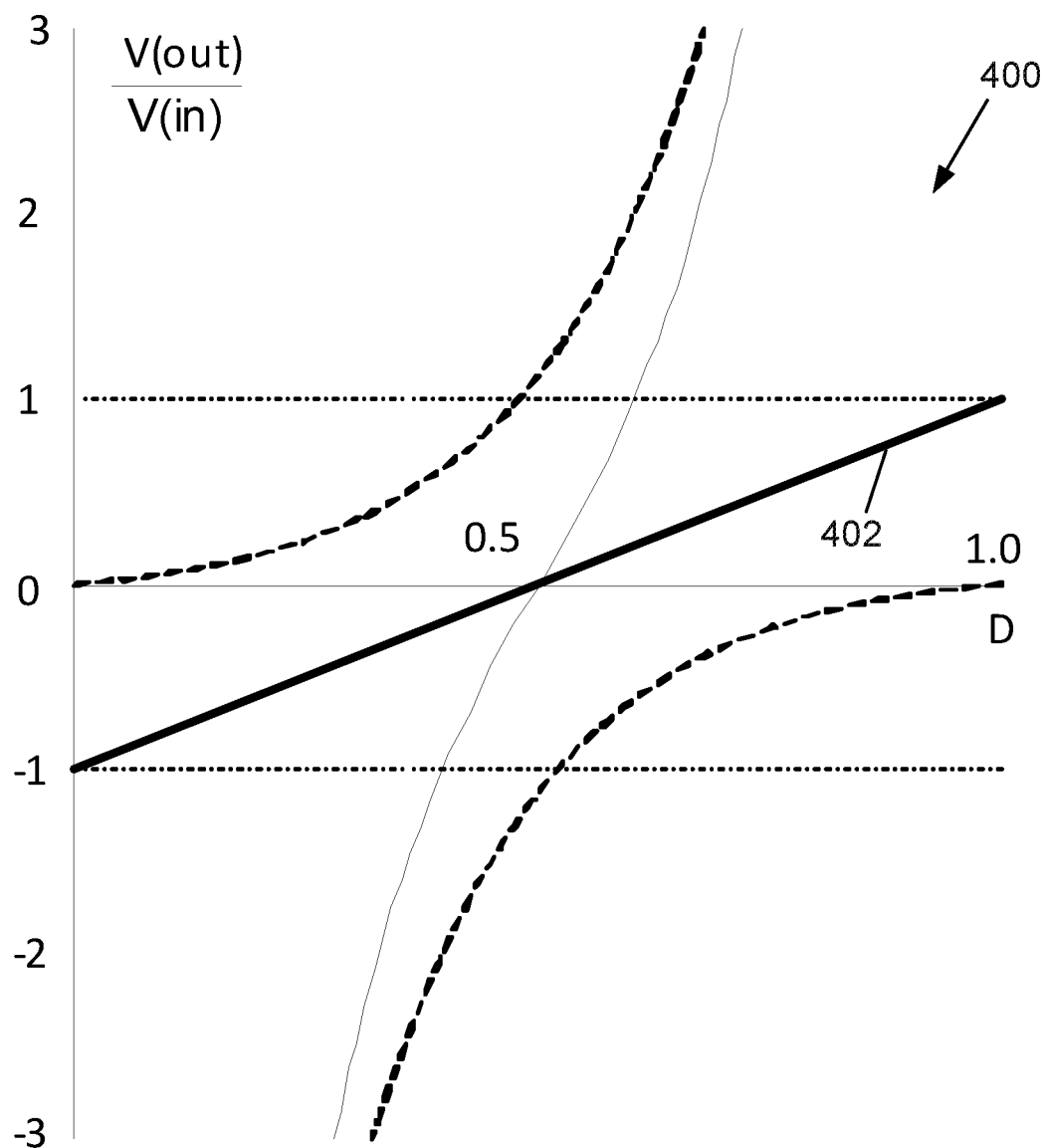
FIG. 4 is a plot of DC gain versus duty cycle for Buck and Zeta Amplifiers.

Each buck converter 302, 304 have a linear DC transfer function which provide for an overall DC transfer function of the amplifier 300 as being linear (i.e., V(at node 318)–V(at node 320)=2D-1). When an audio signal varies the modulation, the output of the amplifier 300 is linearly modulated by the audio signal and amplification of the output voltage and current is provided in a linear manner. Referring briefly to FIG. 4, a chart 400 provides the DC gain versus duty cycle of the class-D amplifier 300, and a line 402 represents the linear nature the DC gain provided by the amplifier.

Returning to FIG. 3, in this implementation, the polarities of nodes 318 and 320 are positive relative to ground. As such, the common-mode voltage component of the output voltage across the load 308 is also positive. This characteristic of the amplifier 300 can be selected for various reasons; for example, for use in single-supply battery operated environments that are realized with integrated circuits. In this implementation, both buck converters 302, 304 are synchronous since current flowing from one buck converter (e.g., converter 302) needs to be absorbed by the other buck converter (e.g., converter 304) while the output voltage is positive relative to ground. An asynchronous converter is unable to absorb the current since reverse currents would be blocked.

Linearity of the buck converters 302, 304 may be lost due to dead-time control when avoiding current shoot-through in the switches 310, 312, 314, and 316. Such a situation can occur for Zeta amplifiers. During these time periods, output signals can become distorted (e.g., odd harmonics may appear) as the gain changes abruptly through the range of duty cycles. Distortion may have other sources; for example, stiffness of the power supply 306 and asymmetric switching edge rates can result in non-linearities of the amplifier 300. One technique to compensate such non-linearities is to employ a feedback scheme (e.g., negative feedback); for example, feedback can be provided by the differential voltage across the load 308 since this voltage component contains the desired audio signal to be output by the amplifier 300.

Figure 5:
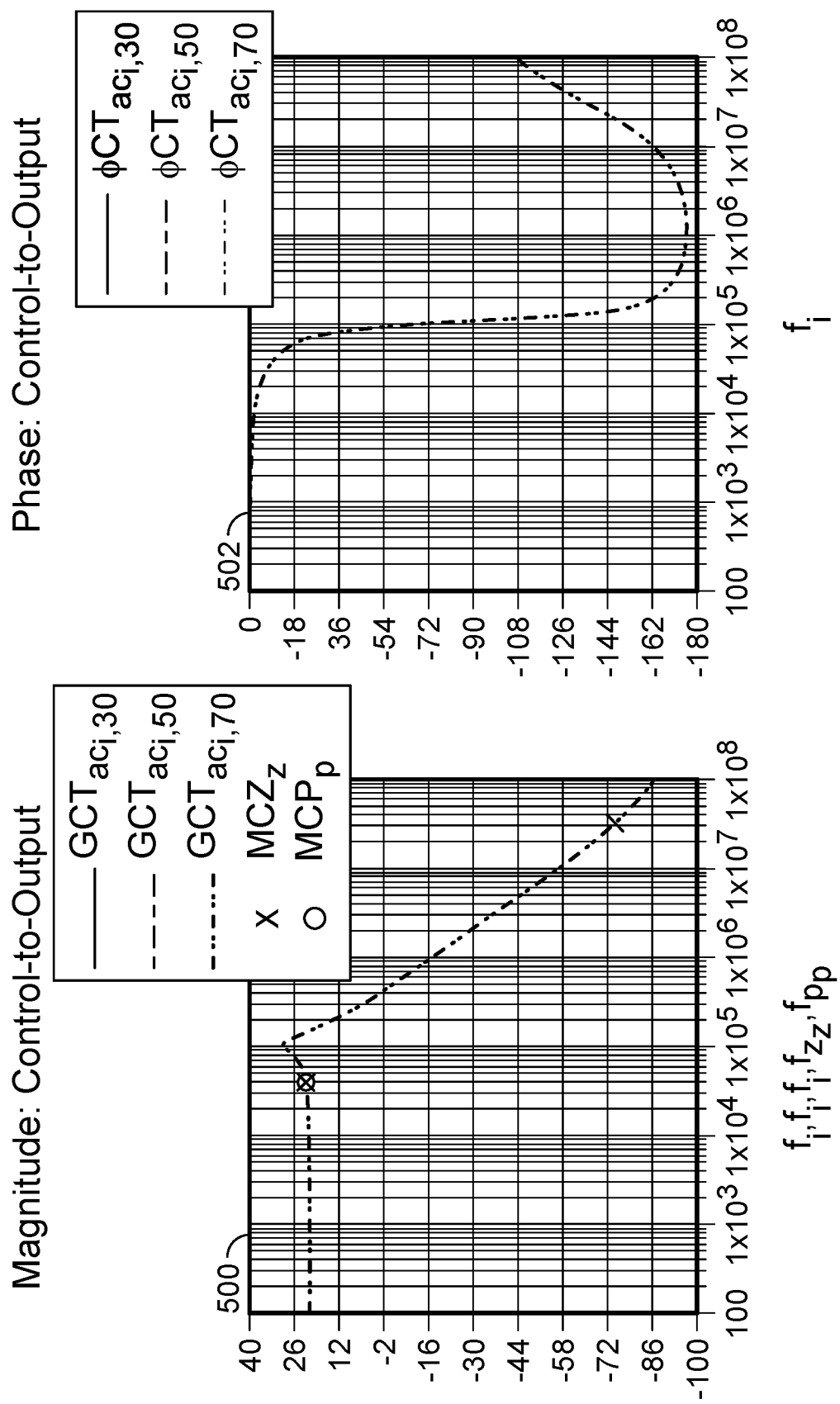
FIG. 5 are control to output magnitude and phase plots of a Buck derived class-D amplifier.

FIG. 5 shows charts 500 and 502 that respectively represent the magnitude and phase of the small signal control (e.g. duty cycle) to differential output response of the amplifier 300. Both charts report the magnitude and phase for three different duty cycles (i.e., 30%, 50% and 70%). For 30%, 50%, and 70% duty cycles the responses are approximately the same (since the gain is linear and the location of poles and zeros do not vary with duty cycle). The gain values provided by chart 500 (e.g., a forward gain of 21.5 dB) provide for reasonable negative feedback gain for output correction. Due to the bipolar nature of the differential output, the 180° phase changes are reported in chart 502 for duty cycles below 50%. From these responses, compensation techniques (e.g., analog or digital techniques) may be employed by a compensator (e.g., a feedback control loop compensator) with only static compensation gain, poles, and zeros.

Figure 6:
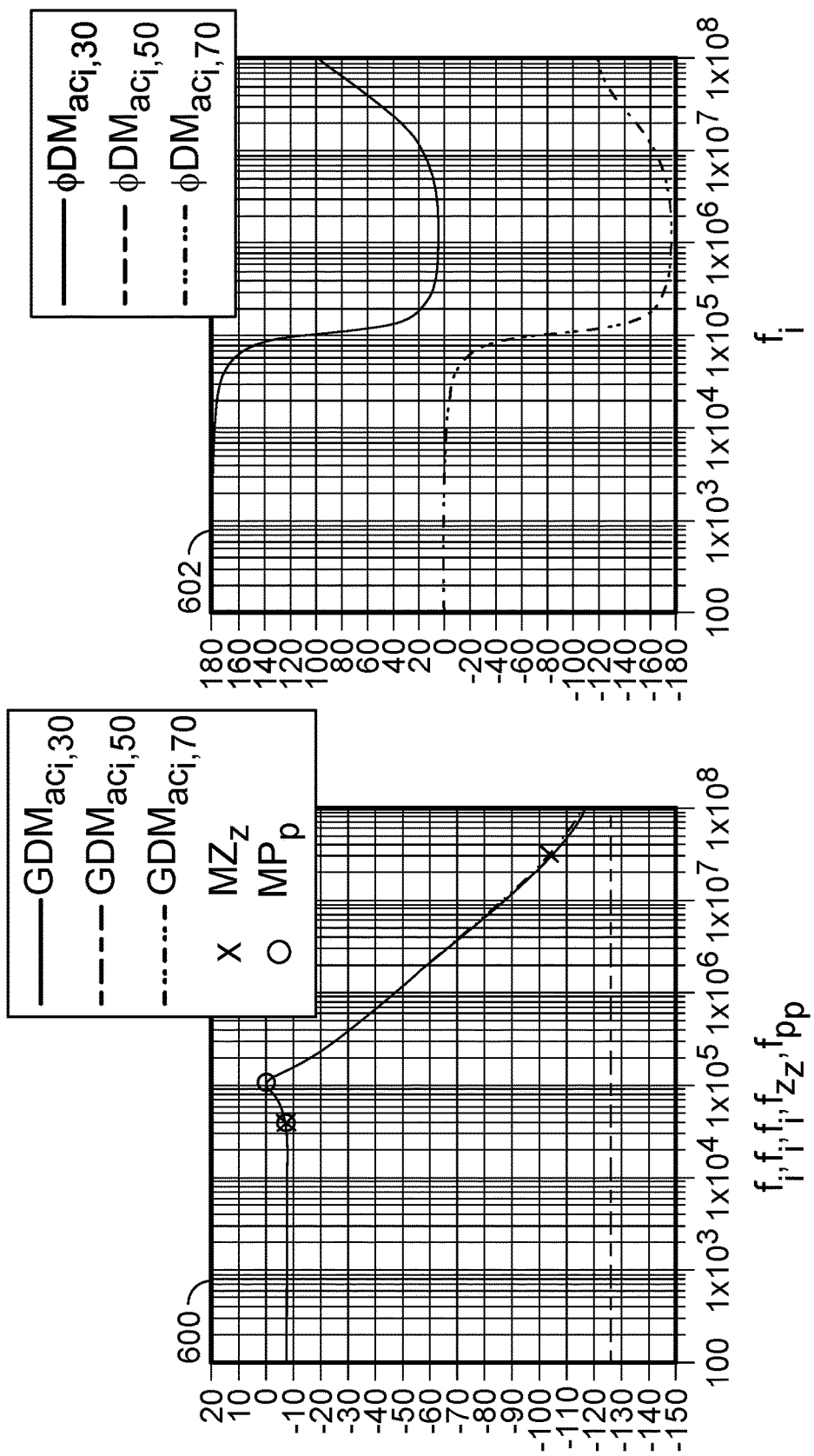
FIG. 6 are supply to output magnitude and phase plots of a Buck derived class-D amplifier.

Referring to FIG. 6, charts 600 and 602 respectively represent the magnitude and phase of the common-mode supply to output response of the amplifier 300 for duty cycles of 30%, 50%, and 70%. For buck derived BTL class-D amplifiers (at 50% duty cycle), the common-mode output does not contribute to the differential audio voltage and current in the load 308 since voltage would appear equally at node 318 and node 320 and no differential audio component would be ideally be generated. However, from a practical perspective, slight differences between components of the two buck power converters 302 and 304, and a common-mode to differential mode gain is present. For duty cycles other than 50%, the supply ripple translates to the output as the pulse widths on the positive and negative halve of the amplifier are deliberately at different duty cycles. As a result, supply variations translate to the output with fixed gain. The phase of the transfer depends on the duty cycle: For duty cycles larger than 50% the phase is 180 degrees out of phase compared to the response for duty cycles smaller than 50% duty cycle. This gain typically appears as an error in the differential response when the voltage of the power supply 306 varies (referred to as a power supply rejection ratio (PSRR) response) and can create audio artifacts and generate perceived distortions. By implementing a feedback compensator using negative differential feedback, these artifacts and distortions can be rendered substantially inaudible.

The feedback compensator can also use a common-mode feedback or common-mode feed-forward correction to prevent the common-mode bias voltage across the load from varying in an excessive manner. By using this compensation, large currents in output filter inductors and capacitors of the amplifier are avoided, which can result in losses. In some implementations, the feedback compensator can employ a first order common-mode control loop to attenuate common-mode voltage variations and address the losses. The control loop assists in maintaining the power supply bias voltage across the load even in instances that where variations in the power supply voltage appear. The feedback compensator can also track a relatively slow changing power supply voltage to prevent asymmetric effects in the output voltage. Differential and common-mode control loops provided by a feedback compensator can therefore reduce the needs for a regulated power supply to the amplifier and thereby keep the amplifier power conversion stage small. The common mode feedback compensator can also be used to minimize the voltages across the switches within the converters to reduce the transistor switching losses. The reference of the common mode loop can by adjusted for such purpose.

Figure 7:
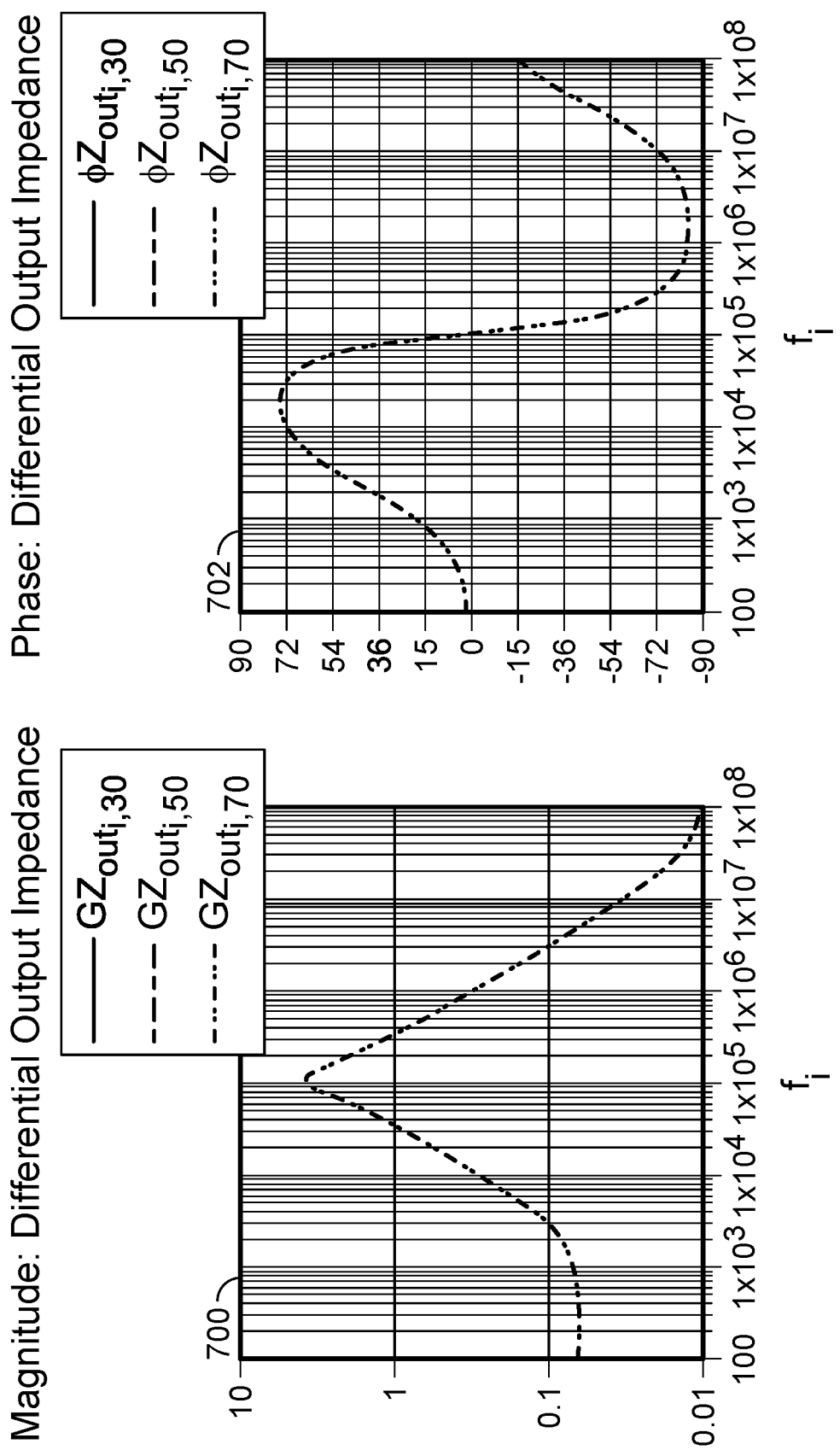
FIG. 7 are differential output impedance magnitude and phase plots of a Buck derived class-D amplifier.
Figure 7A:
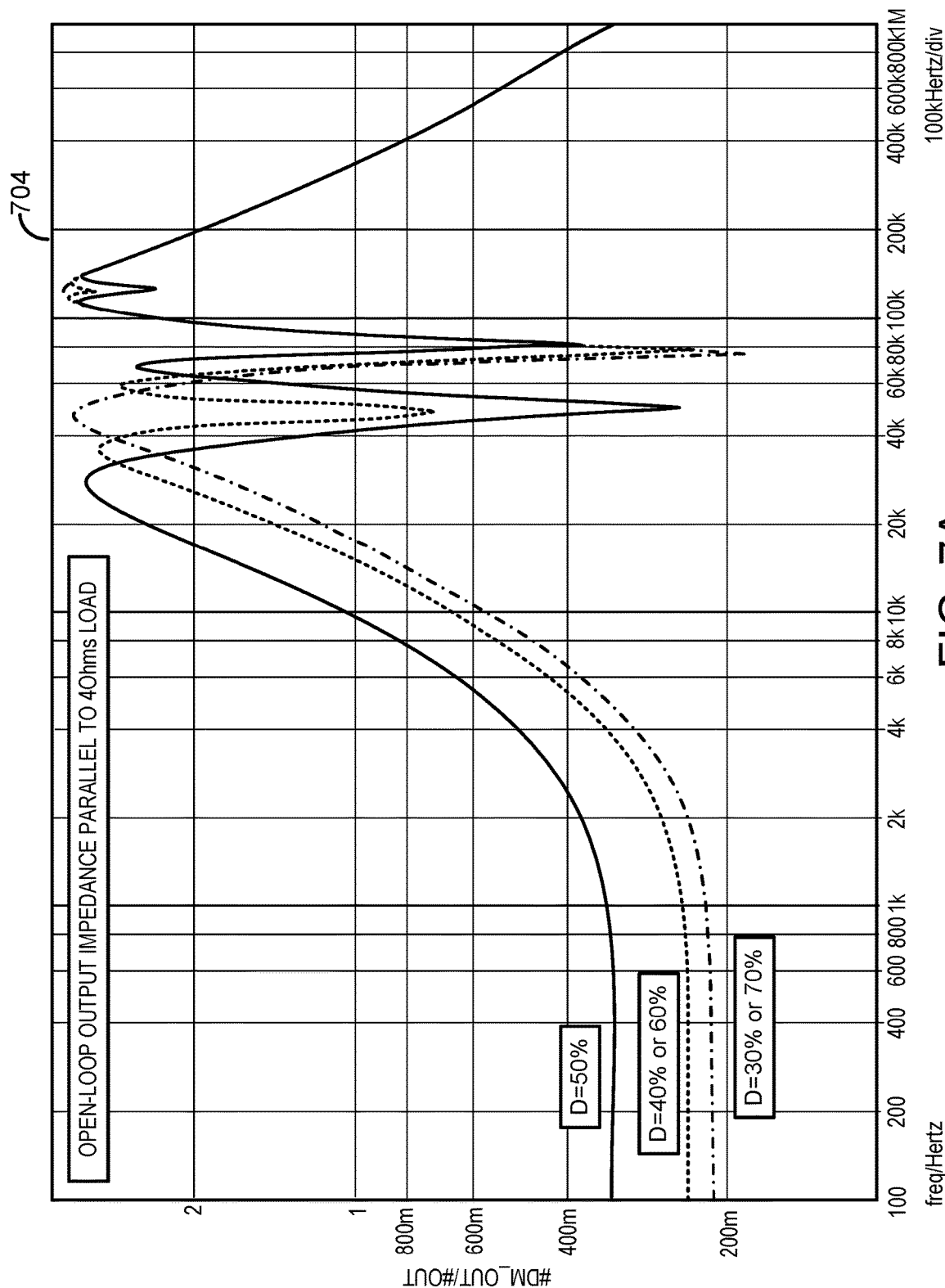
FIG. 7A is a differential output impedance magnitude plot of a Zeta converter.

Referring to FIG. 7, charts 700 and 702 respectively represent the magnitude and phase of the differential output impedance for various duty cycles for the amplifier 300. In this particular implementation, inductance values of approximately 2.2 micro Henry (µH) and capacitance values of approximately 1 micro Farad (µF) may be employed; however, in other implementations, other inductance and capacitance values may be used. Similar to the charts shown in FIGS. 5 and 6, the output impedance is the same for all choices of the duty cycles. In general, the output impedance is provided by a combination of parasitic resistances from components of converters stages 302, 304 and an output filter. Substantially constant for low audio frequencies, the differential impedance increases with frequency due to inductors in the output filter. In this example, around 100 kHz this inductance can resonate with the capacitors in the output stage. Increasing in frequency beyond 100 kHz, the output impedance decreases as the capacitors in the filter substantially dominate the output impedance (e.g., limited by the capacitor parasitic equivalent series resistance (ESR)). In this example, the ESR introduces a double zero near 31 MHz and the impedance becomes the sum of the ESR of the output filter capacitors. As provided by the charts 700, 702, the differential impedance can vary considerably across frequency even in the audio band. Referring to FIG. 7A, a chart 704 presents the output impedance of a Zeta amplifier for various duty cycles. In general, the magnitude response of the output impedance behaves more resistively due to the selection of smaller inductors and capacitors in the Zeta amplifier due to the higher frequency operation to push response features above the audio frequency band.

Figure 8:
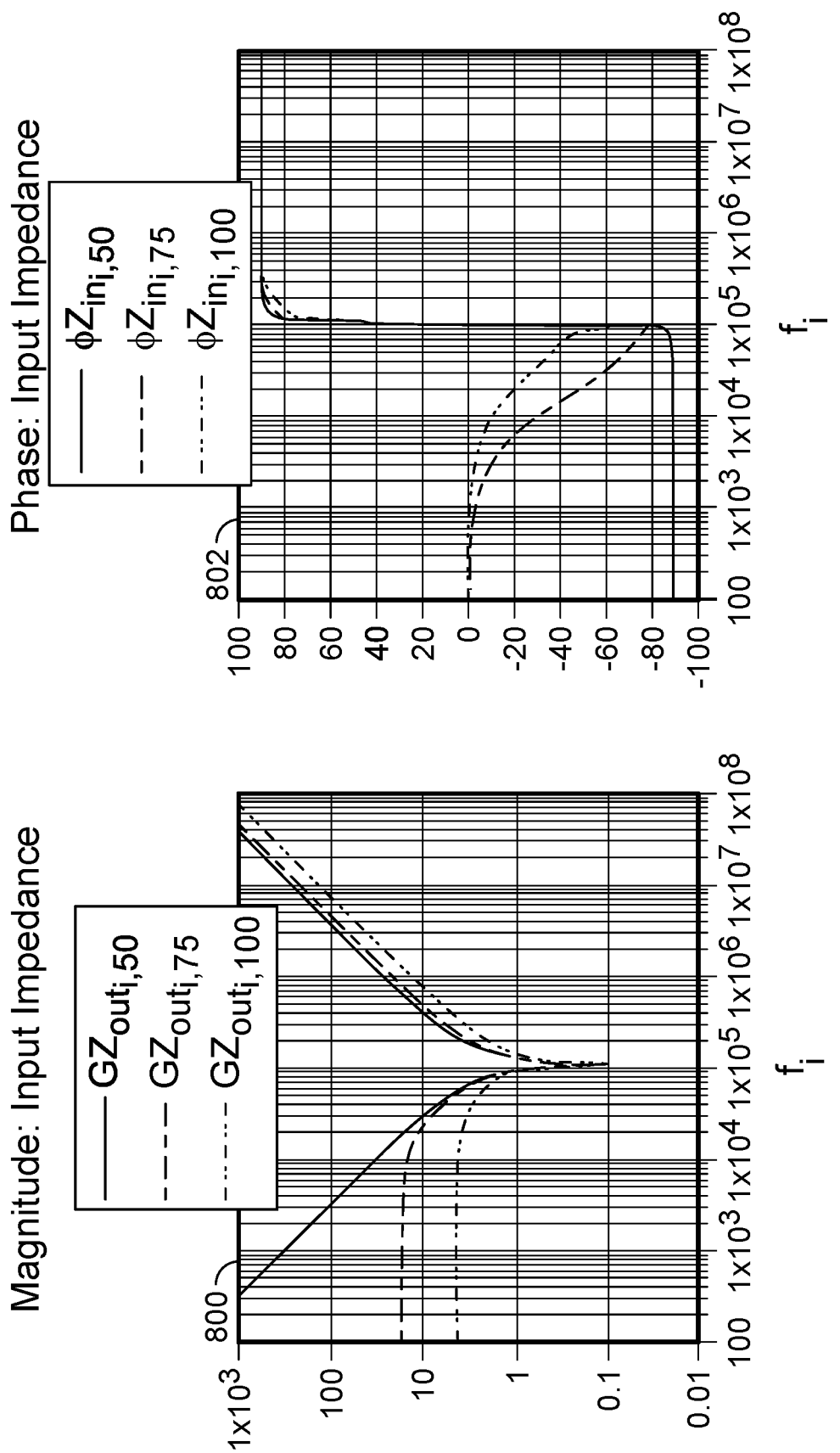
FIG. 8 are input impedance magnitude and phase plots of a Buck derived class-D amplifier.
Figure 8A:
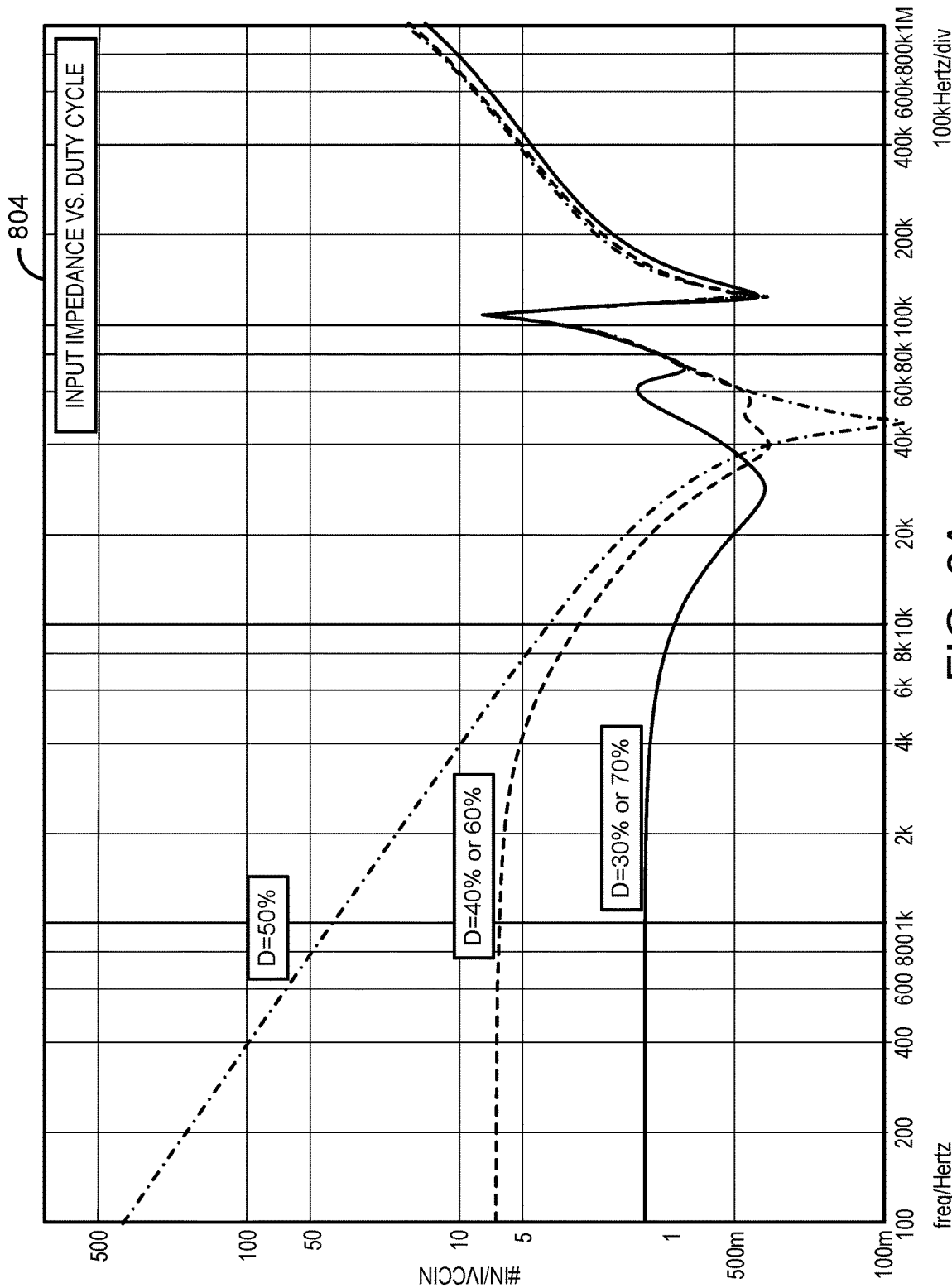
FIG. 8A is an input impedance magnitude plot of a Zeta converter.
Figure 9:
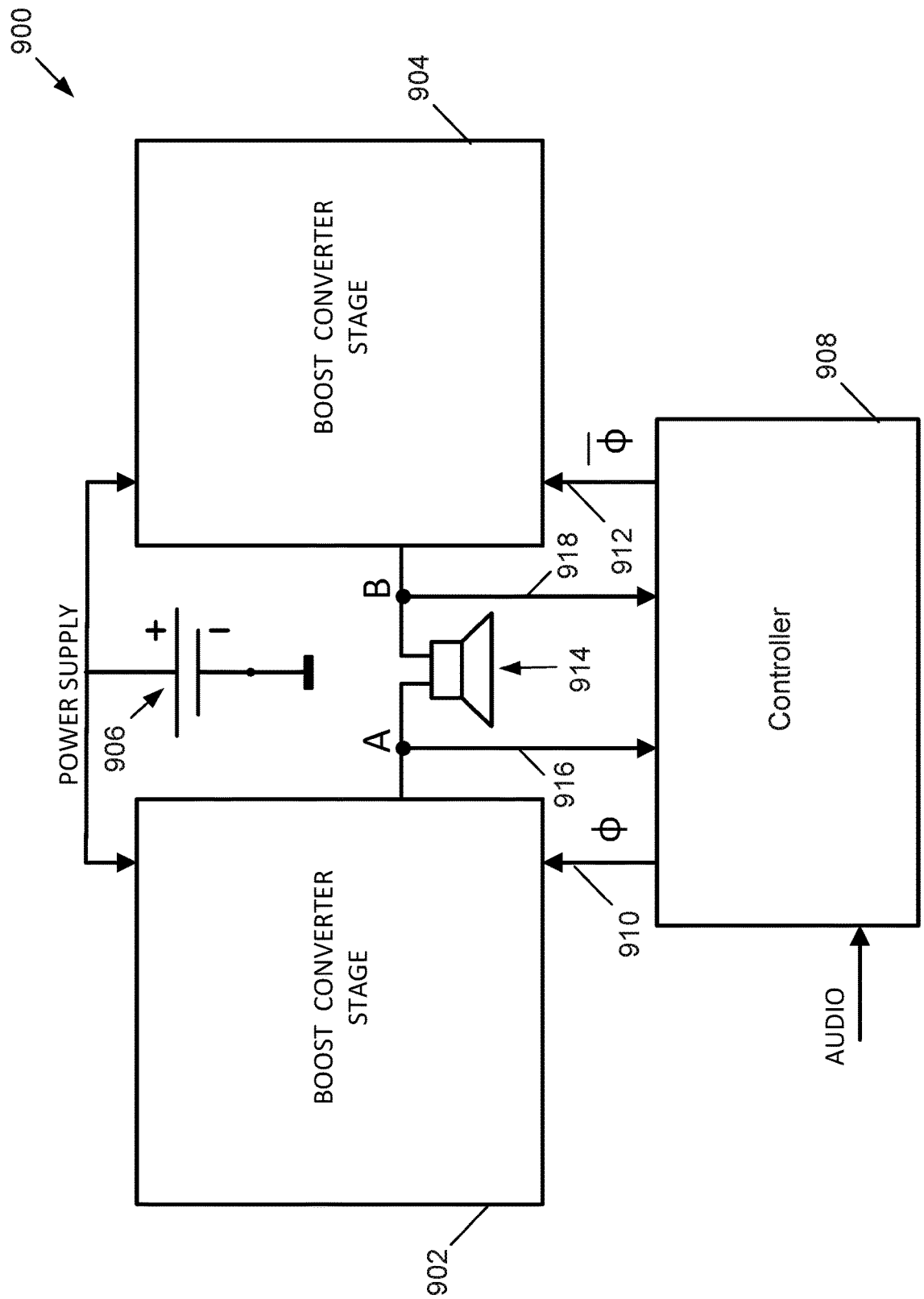
FIG. 9 is a block diagram of a self-boosting push pull amplifier.

Referring to FIG. 8, charts 800 and 802 respectively present the magnitude and phase input impedance of a buck derived class-D BTL amplifier for duty cycles of 50%, 75%, and 100%. Similar if not identical magnitude and phase input impedances would be provided for other duty cycles (e.g., 0%, 25%, and 50%). The buck derived class-D BTL amplifier is derived from a buck regulator and its input current generally has a pulsating characteristic. The BTL configuration of this amplifier assists with mitigating the current situation as the pulsing of the input current is complementary at 50% duty cycle between the positive and negative sides of the amplifier for AD modulation. Statistically, the amplifier spends most time at 50% duty cycle and the system benefits from ripple cancelation most of the time. Through this mitigation, the pulsing input current becomes a quasi-DC current with a superimposed saw-tooth shaped ripple. This can drastically reduce the size of the EMC input filter that is needed in typical applications to avoid conducted and radiated emissions from a supply wire harness. For a 50% duty cycle, a differential output is absent and very little of any input current flows and the impedance is large. The input impedance reduces towards higher frequencies due to the complex impedance of the output filter of the amplifier. At resonance the magnitude response (as shown in chart 800) reaches a minimum and then increases with higher frequencies. At 50% duty cycle the input of the amplifier acts capacitive towards a resonance at 100 kHz. At duty cycles away from 50%, the input impedance reduces at low frequencies. The input impedance acts more resistively further away for 50% and the input impedance reduces as the input current increases. However, the resonance introduced by the input filter remains in place. Due to the high-Q nature of the resonance, an abrupt 180-degree phase shift around 100 kHz is present (as shown in chart 802). Care should be taken with combining this with EMI input filters, not to create instabilities. Referring to FIG. 8A, a chart 804 presents the input impedance of a Zeta amplifier for various duty cycles. In general, the input impedance includes features that are pushed to higher frequencies out of the audio band. While comparable to a buck derived amplifier, the high frequency features change position with different duty cycles which differs from the buck derived amplifier. These low frequency features behave similar to buck derived amplifier. Referring to FIG. 9, one or more designs may be employed for an amplifier that is capable of self-boosting; for example a power converter may be introduced that boosts the output voltage of the amplifier over the input voltage. The DC duty cycle reference can be replaced by a signal that is modulated by an audio signal. The amplifier may employ various designs; for example, a push pull design may be used due to its ability to increase (i.e., double) the output voltage. Such a design generally includes at least two power converters being connected to a load in a manner similar to a buck derived class-D amplifier that includes two buck converters connected to a load. Switch controlling of the two power converters is similarly provided. The two power converters can be driven in complementary manner. For example, one power converter can be driven by a complementary duty cycle relative to the other power converter. Using this design, a two-state modulation or out-of-phase (AD) modulation can be employed, a three-state modulation or in-phase (BD) modulation can be used, etc.

Figure 10:
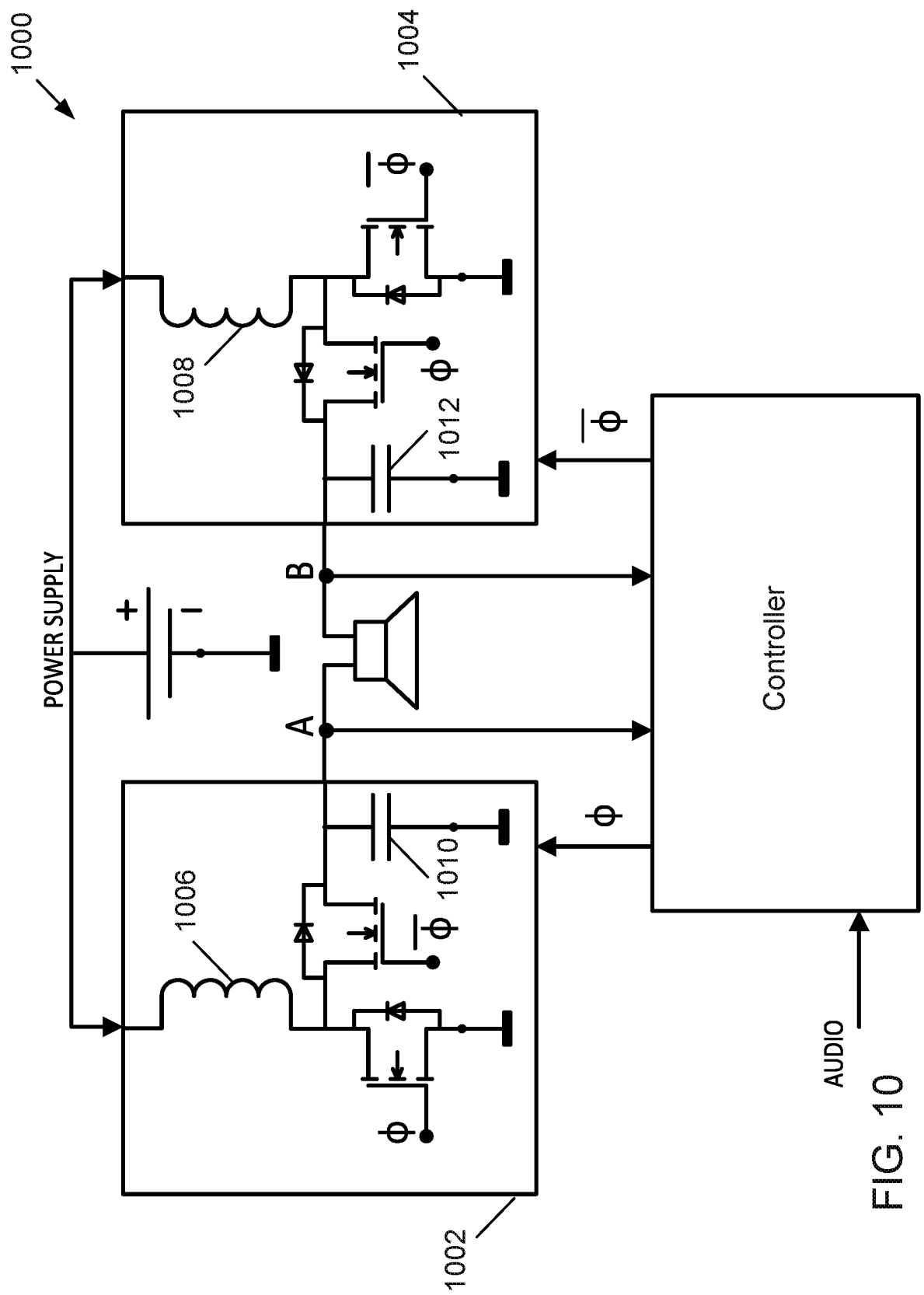
FIG. 10 is circuit diagram of a boost derived self-boosting push pull amplifier.

FIG. 9 shows an exemplary design of power converter based self-boosting amplifier 900. In this example, the amplifier 900 is second order and is synchronous so both source and sink currents can provide a bi-directional output. In this example, the amplifier 900 includes two boost converter stages 902, 904 that are supplied by a power supply 906 (e.g., one or more batteries). A controller 908 receives an audio signal and provides corresponding modulated signals (highlighted by input lines 910 and 912) to each of the boost converter stages 902, 904 for delivering the audio to a load 914 (e.g., a speaker). In some instances, right half plane zeros (RHPZ) may be present in the control-to-output and supply-to-output transfer characteristics of the amplifier. Frequencies at which the RHPZ occur generally depend on component values and parasitic resistances, and the RHPZ may change its position towards lower frequencies as duty cycle changes from 50%. In general, compensation of the RHPZ with a canceling pole is not achievable along with high open loop gain through employing a feedback compensation technique that reduces gain as the location of the RHPZ in the frequency domain is approached. This is because the zero adds an additional 180-degree phase shift (instead of a lag as is the case with a LHPZ). The normal process of adding a zero-compensating pole adds an additional 180 degrees thereby destabilizing the system completely. The feedback adds in phase with the input thereby causing a runaway condition. In this example, the feedback is provided (via signal lines 916 and 918) from nodes A and B connected to the load 914. Due to the avoidance of RHPZ compensation, such amplifiers have generally low bandwidth along with low gains at higher audio frequencies which can limit distortion prevention. FIG. 10 shows one implementation (of the block diagram shown in FIG. 9) in which each of the second order boost converters 1002 and 1004 include an inductor (e.g., inductors 1006 and 1008) and a capacitor (e.g., capacitors 1010 and 1012). This particular amplifier also provides no intrinsic means to limit the current flow from the battery source which may yield unsafe conditions during an output short to ground.

Figure 11:
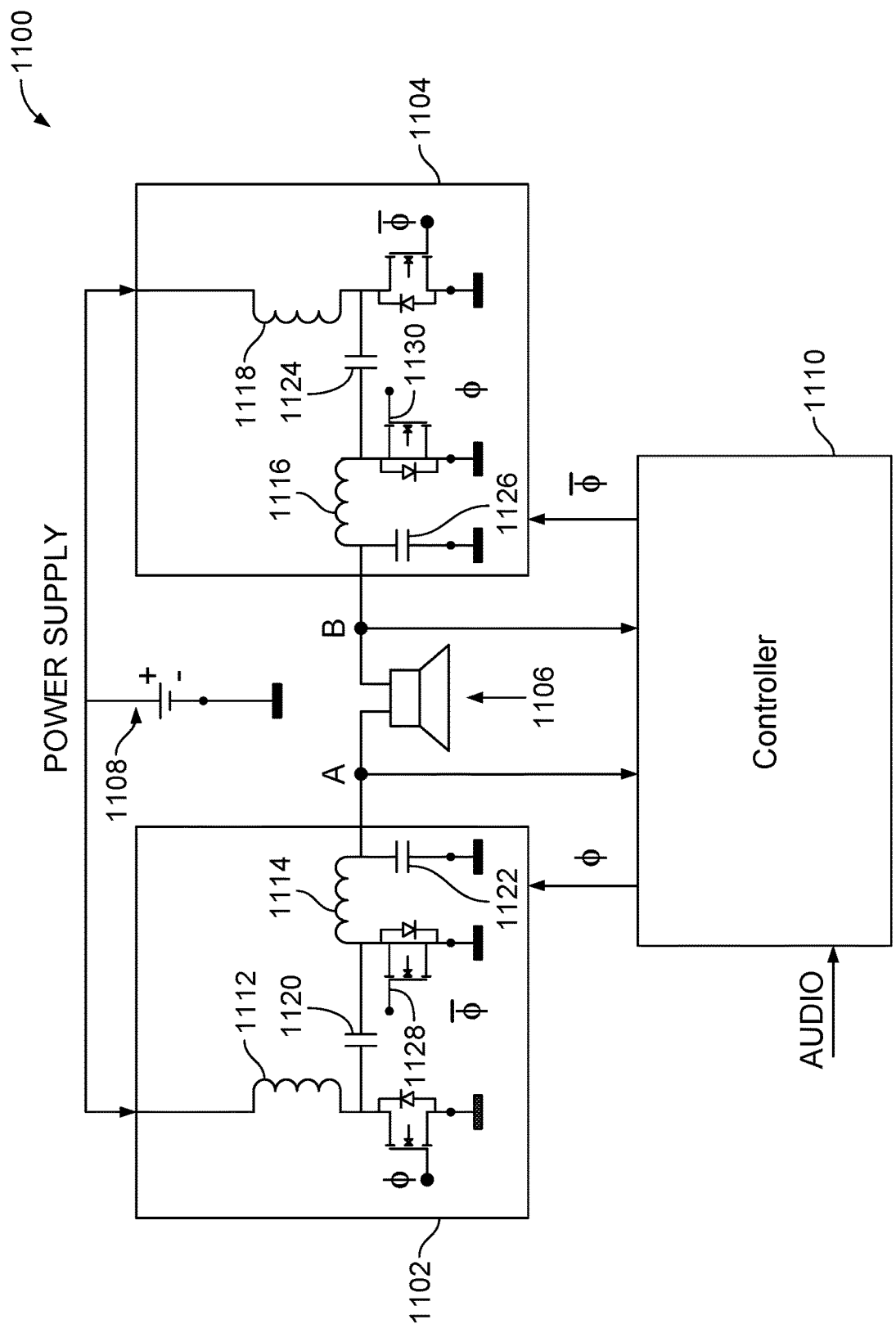
FIG. 11 is a circuit diagram of a Ćuk converter derived self-boosting push pull amplifier.

Referring to FIG. 11, other designs may be utilized for such amplifiers. In the illustrated example, an amplifier 1100 employs a push pull design that includes two Ćuk power converters 1102, 1104 that are connected to a load 1106 (e.g., a speaker). Similar to the previous design, a power supply 1108 (e.g., a battery) delivers power to the amplifier 1100 and a controller 1110 provides a modulated version of an audio signal to the two Ćuk power converters 1102, 1104. In some arrangement, the controller 1102 may provide other functionality, such as feedback compensation. In general, the Ćuk power converters 1002, 1004 employ inductors and capacitors to transfer and convert energy such that their output voltage is larger than the input voltage. A considerable drawback of this arrangement is that the output bias of this amplifier is negative which creates design complications when the circuitry is implemented on an integrated circuit due to possible transistor latch up considerations. As shown in FIG. 11, each of the Ćuk power converters 1102, 1104 include two inductors (e.g., inductors 1112 and 1114 in power converter 1102, and inductors 1116 and 1118 in power converter 1104) and two capacitors (e.g. capacitor 1120 and 1122 in power converter 1102, and capacitors 1124 and 1126 in power converter 1104). The negative output bias requires transistors 1128 and 1130 to be upside down which may complicate the integrated circuit design.

The amplifier 1100 is synchronous to allow for both current sourcing and sinking for enabling a bi-polar current at the load 1106. In this example, the Ćuk power converters 1102, 1104 are 4th order converters and as mentioned above include more components than the amplifier design shown in FIG. 9. For this type of amplifier design, the control-to-output and supply-to-output transfer functions can be complex and compensations techniques (e.g., analog feedback compensation techniques) via the controller 1110 can also be complex. Additionally, the presence of the RHPZ will limit the bandwidth. The design of amplifier 1100 can also result in conjugate zero and pole pairs that can produce resonances in the audio frequency band that would need to be controlled. In some arrangements, inductor coils are coupled in the Ćuk power converter. Further, the RHPZ of this amplifier 1100 would be required to be placed above the audio band to avoid reducing the audio amplifier audio bandwidth considerably, similar to the amplifier 900 (shown in FIG. 9). In some instances, the design of amplifier 1100 can introduce harmonic distortion (due to its non-linearity) and a considerable gain (40 dB) across the audio band may be needed for compensation. The design can also introduce voltage and current stress on switches (e.g., FETs) included in the Ćuk power converters 1102, 1104 due to the presence of high component voltages. Similarly, due to the transfer or energy, the capacitors in the Ćuk power converters 1102, 1104 can also experience such stresses.

Figure 12:
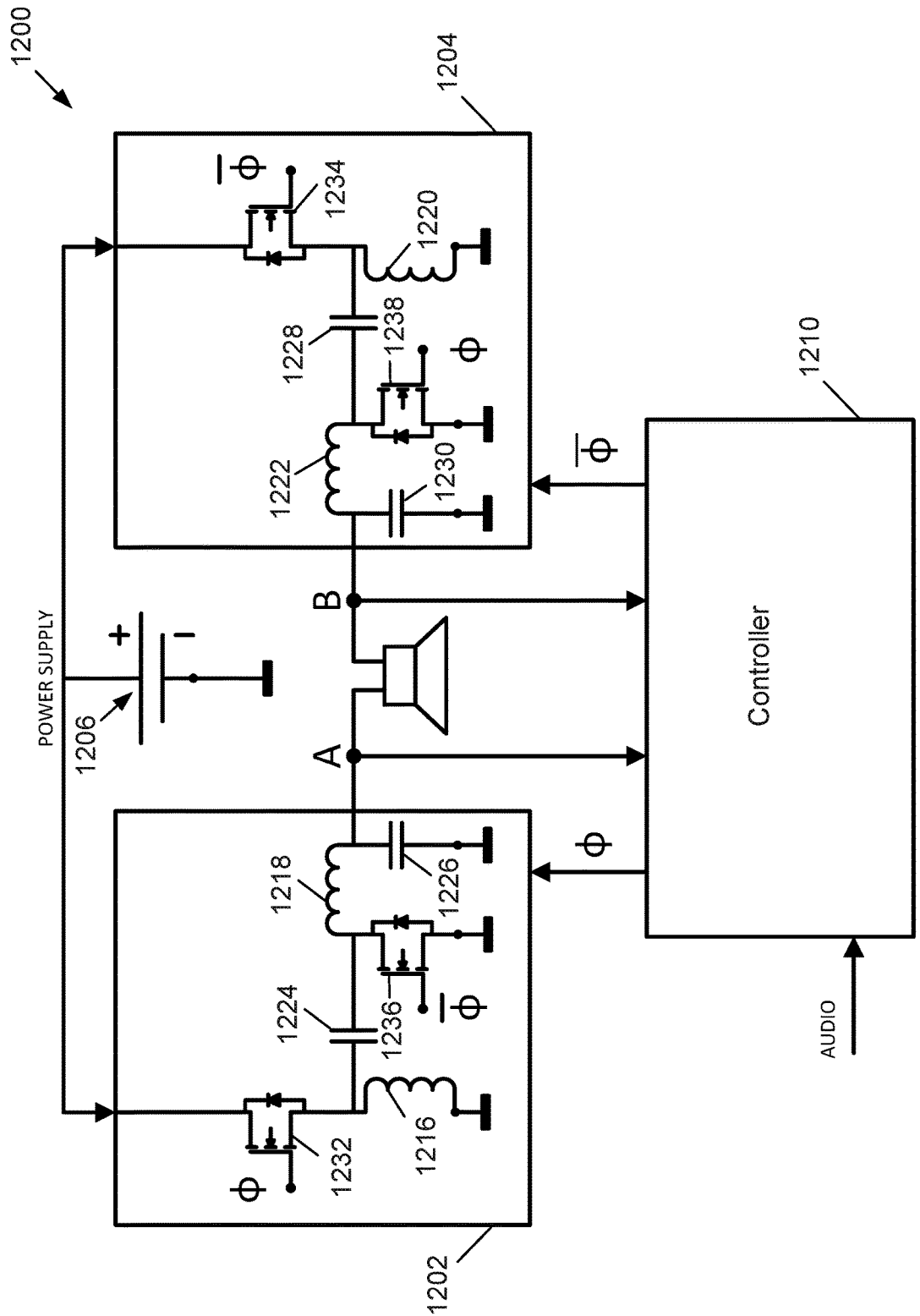
FIG. 12 is a circuit diagram of a Zeta converter derived self-boosting push pull amplifier.

Referring to FIG. 12, a design for an amplifier 1200 is shown that employs a power converter topology, which is fourth order. In general, the amplifier 1100 has a self-boosting push-pull design and uses a Zeta power converter design that can be compensated to provide full audio bandwidth. Another benefit is that this Zeta topology does not invert the output bias. A benefit is that this amplifier is naturally short circuit protected due to the series switch and capacitor. In this example the amplifier used a synchronous Zeta power converter topology. As shown in the figure, the amplifier 1200 includes two Zeta power converters 1202, 1204, that receive power from a power supply 1206 (e.g., a battery) and drive a load 1208 (e.g., a speaker). Audio signals received by the amplifier 1200 are provided by a controller 1210 to the power converters 1202, 1204, and nodes A and B located on either side of the load 1208 provide feedback to the controller 1210 (e.g., for compensation techniques). The two Zeta power converters 1202 and 1204 are driven by a complementary duty cycle relative to one another. Using this design, out-of-phase (AD) modulation or in-phase (BD) modulation may be employed.

As shown in the figure, each of the Zeta power converters 1202, 1204 are fourth order and include two inductors in each of the Zeta converter halves (e.g., boost inductors 1216 and 1220 in power converters 1202 and 1204 and output inductors 1218 and 1222 in power converter 1202 and 1204) and two coupling capacitors (e.g. capacitor 1224 and 1228, and two output capacitors 1226 and 1230). Each Zeta power converter includes two switches (e.g., boost FET switches 1232 and 1234 in power converter 1202 and 1204, and two output FET switches 1236 and 1238 in power converter 1202 and 1204). Compared to the Ćuk power converters 1102, 1104 shown in FIG. 11, the circuitry of the Zeta power converters 1202, 1204 is different. For example, connections of inductors in the Zeta power converters 1202, 1204 differ from inductor connections of the Ćuk power converters 1102, 1104. In the illustrated examples, the inductors 1216 and 1220 of the Zeta power converters 1202, 1204 are connected to ground while the inductors 1112 and 1118 of the Ćuk power converters 1102, 1104 are connected to the high side of the power source 1108. Additionally, positions of connected switches are different for two designs. In particular, the FET switch 1232 in Zeta power converter 1202 and the FET switch 1234 of Zeta power converter 1204 are connected to the high side of the power source 1108 while FET switches in the Ćuk power converters 1102, 1104 are each connected to ground. Additionally, FET switch 1236 (of Zeta power converter 1202) and FET switch 1238 (of Zeta power converter 1204) are connected upside down compared to the output FET switch 1128 (of Ćuk power converters 1102) and output FET switch 1130 (Ćuk power converters 1104). As such, the positions of these inductors and switches (e.g., the input inductors and input switches) have been reversed. Comparing the Ćuk power converter to the Zeta power converter, the Ćuk power converter has reduced input ripple current compared to the Zeta power converter. The Zeta converter's boost inductor voltage switches from positive to negative voltages each cycle which typically calls for design considerations for the gate driver of the input stage when N-MOS transistors are used as the gate driver most float with the source voltages of switches 1232 and 1234. When using P-MOS switches, the gates are just pulled down to ground potential.

Figure 12A:
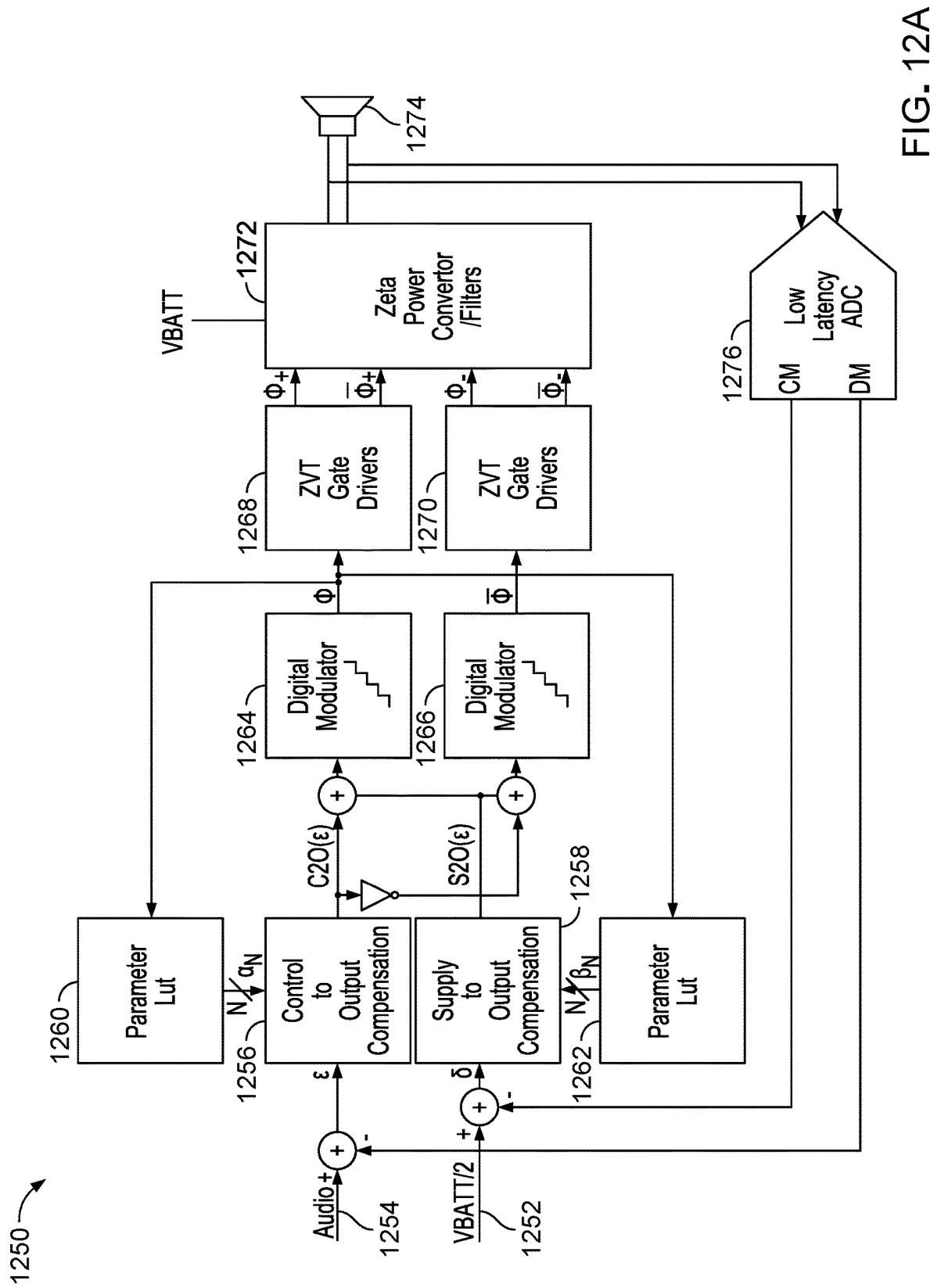
FIG. 12A is a block diagram of a Zeta converter based self-booting push pull amplifier.

Referring to FIG. 12A, a block diagram 1250 of a Zeta converter based self-booting push pull amplifier system is presented. A supply voltage reference is provided (e.g., from a battery) into an input 1252 and audio is received on input 1254. The amplifier includes compensators 1256, 1258 that respectively receive parameter data from parameter look up tables (LUTs) 1260, 1262. In this implementation digital modulators 1264, 1266 provide signals to respective ZVT gate drivers 1268, 1270 that provide signals to a Zeta Power Conversion/Filter stage 1272. Other switching techniques can also be employed. An output signal is provided to a load 1274 (e.g., a speaker), which is also provided to a low latency analog-to-digital converter 1276 for providing feedback (e.g., CM and DM) to the compensators 1256, 1258.

Figure 13:
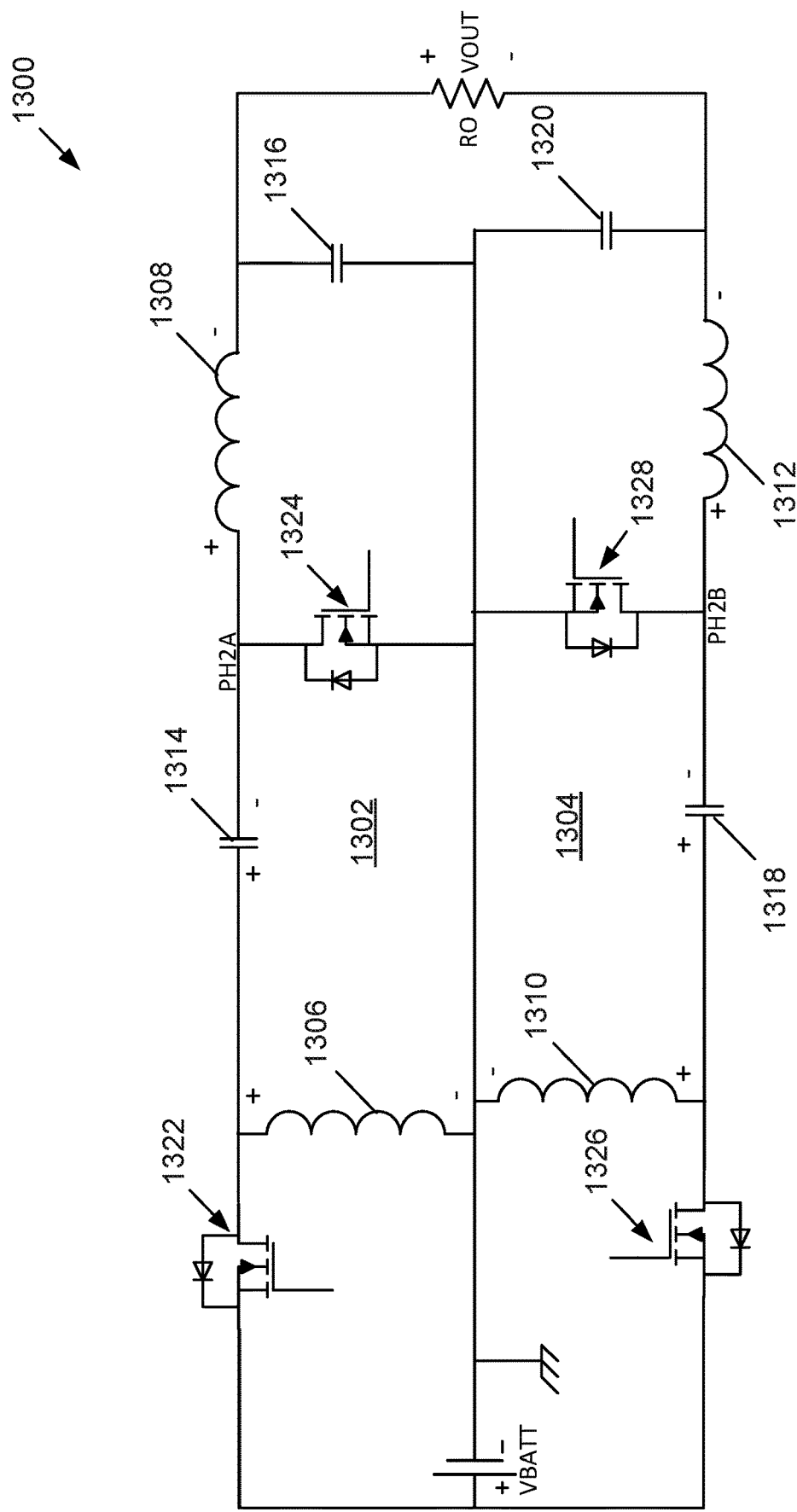
FIG. 13 is a circuit diagram of a Zeta converter derived self-boosting push pull amplifier.

Referring to FIG. 13, a compact version of a Zeta-based amplifier 1300 includes two Zeta power converters 1302 and 1304. Each of the Zeta power converters include two inductors (e.g., inductors 1306 and 1308 in power converter 1302, and inductors 1310 and 1312 in power converter 1304) and two capacitors (e.g. capacitor 1314 and 1316 in power converter 1302, and capacitors 1318 and 1320 in power converter 1304). Each of the Zeta power converters also includes two switches (e.g., switches 1322 and 1324 in power converter 1302, and switches 1326 and 1328 in power converter 1304). Generally, such Zeta amplifiers include approximately the same number of switches as other designs (e.g., buck derived, boost derived and Ćuk derived class-D amplifiers) and associated parameters (e.g. die area, cost, etc.) are comparable. In this example FETs are used to implement the switches 1322-1328; however, other type of switching technology may be employed in some arrangements.

FIGS. 14-22 illustrate the functional aspects of the Zeta amplifier 1300 (shown in FIG. 13) during steady state conditions. For this illustration, each of the inductors (e.g., inductors 1306, 1308, 1310, and 1312) have equivalent inductance values, and each of the capacitors (e.g., capacitors 1314, 1316, 1318, and 1320) have equivalent capacitance values. However, in some implementations, inductance values and/or capacitance values may differ.

Figure 14:
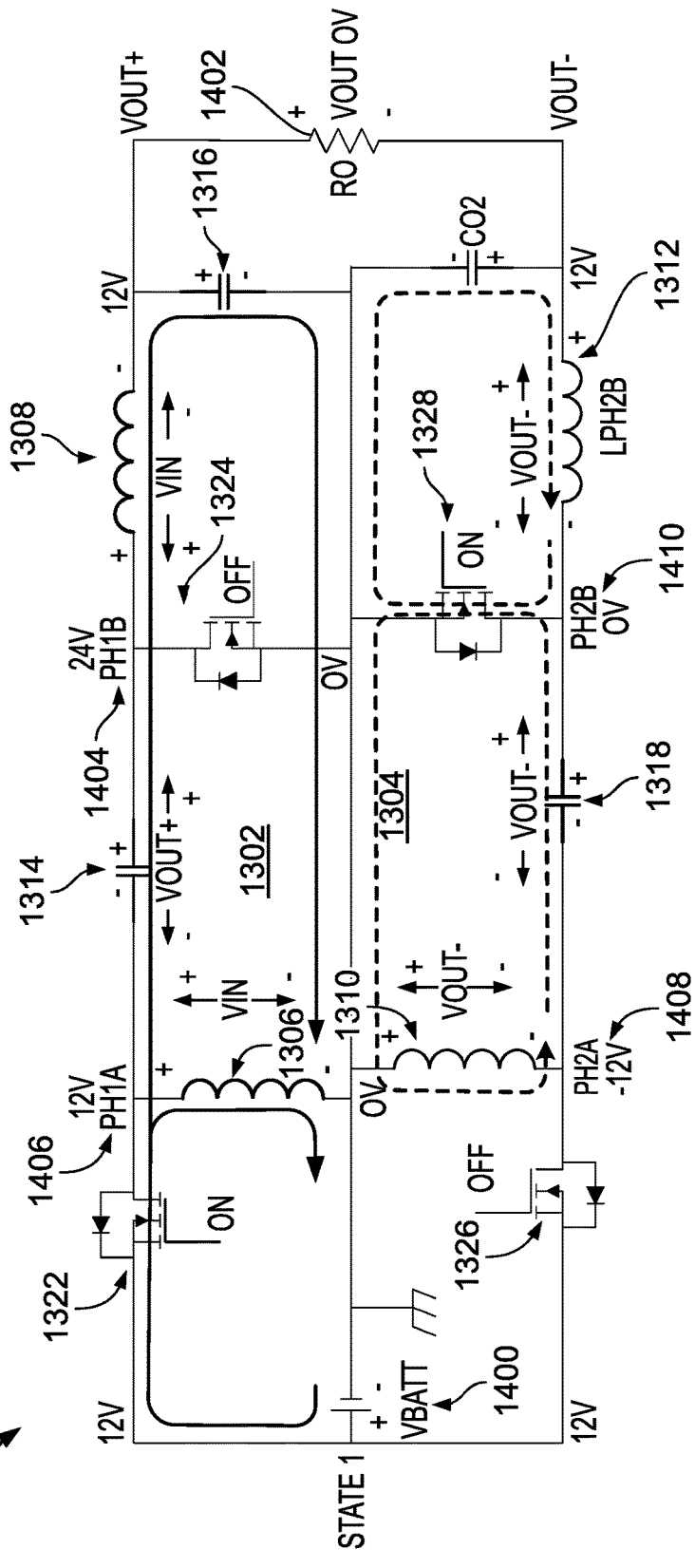
FIGS. 14-16 illustrate states of a Zeta converter based self-boosting push pull amplifier operating with a 50% duty cycle.

In general, using out-of-phase AD modulation, three switch states are cycled through for the Zeta amplifier 1300 in a repetitive manner (e.g., state 1, state 2, state 3, state 2, state 1, state 2, state 3, state 2 . . . ). The Zeta amplifier 1300 is considered to be in a steady-state of operation and the output is 0 volt differential mode and thereby has zero load current. Steady-state is considered to mean that the programmed duty cycle (e.g., D=50%) and differential output voltage are near constant (e.g., 0 volt). Referring to FIG. 14, the four switches 1322, 1324, 1326, and 1328 (e.g., FETs as shown in FIG. 13) are controlled in an interleaved manner: switch 1322 being out of phase with switch 1324, and switch 1326 and in phase with 1328. During the dead-time phase, all four switches 1322, 1324, 1326, and 1328 are off. While the described design uses out-of-phase (AD) modulation, in some implementations the design may be adjusted to employ in-phase (BD) modulation or other modulation variants.

Each of the Zeta power converters 1302 and 1304 included in the Zeta amplifier 1300 generally operate in a two-step process to move energy from input to output. Initially, an input inductor is charged from the supply (e.g., the battery) and at the same time, an output inductor is charged by a coupling capacitor. The input inductor then transfers its stored energy to re-charge the coupling capacitor while the output inductor discharges to the output capacitor and the load. There is a dead-time state in between these energy transfers to ensure no shoot-through currents occur from the supply to ground, thus it is a two-step process with three switch states.

In switch state 1, as illustrated in the FIG. 14, switch 1322 is on (in Zeta power converter 1302) and switch 1324 is off. Node 1406 is effectively connected to the supply 1400, which forces the voltage across inductor 1306 to equal that of the power supply 1400 (e.g., a 12-volt battery in this instance), causing inductor 1306 to charge with energy. Node 1406 voltage is held at that level by the supply 1400, while the previously stored voltage across capacitor 1314 adds in series on top of this voltage, causing the voltage at node 1404 to go above the battery supply voltage (e.g., to 24 volts in this instance). Capacitor 1314 operates as a voltage source to the output stage, discharging its stored energy into inductor 1308, capacitor 1316, and subsequently the load 1402.

Figure 16:
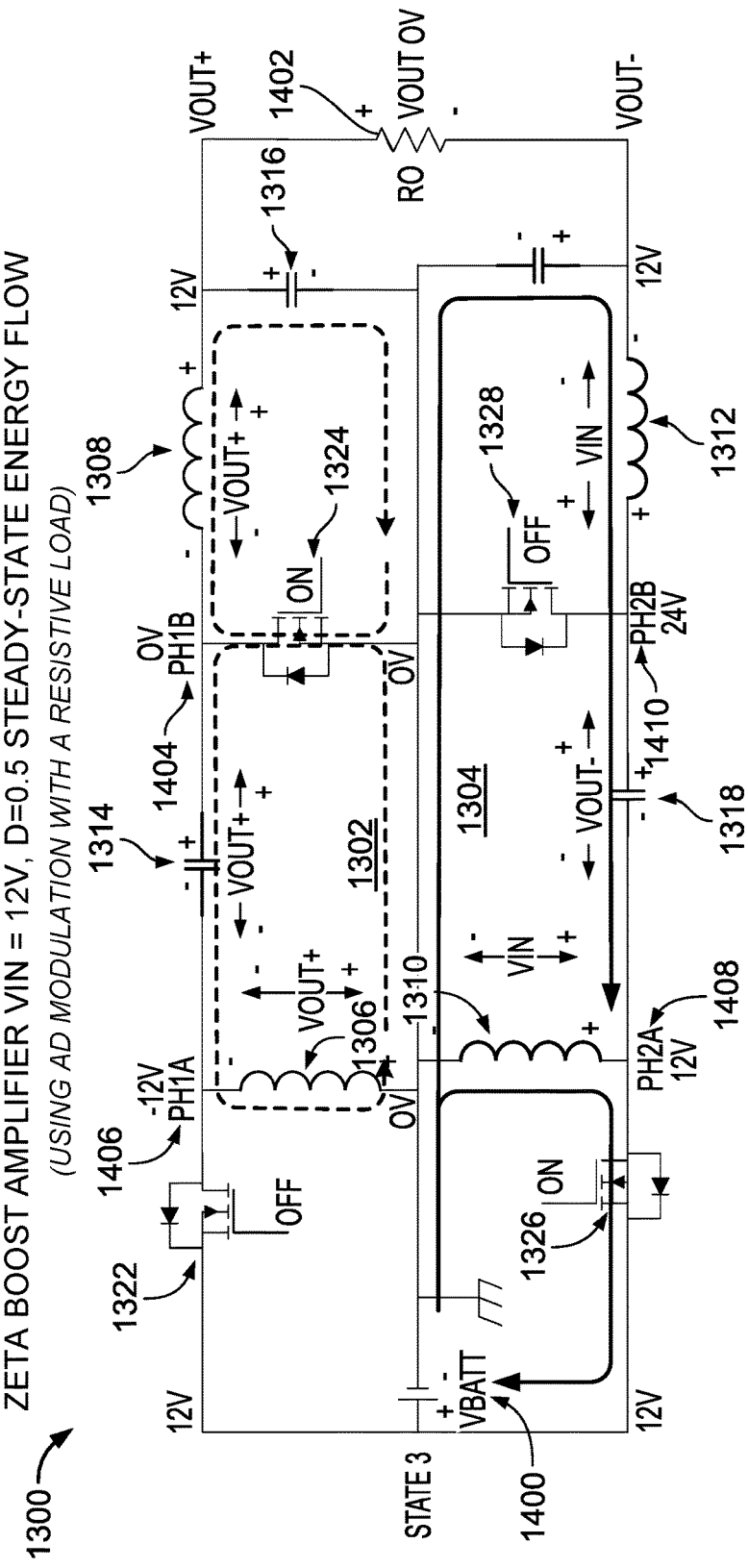

Referring to FIG. 16, switch state 3 of the Zeta amplifier 1300 is shown with switch 1322 being turned off and switch 1324 being turned on. With switch 1322 turned off, Inductor 1306 is no longer connected directly to power supply 1400 so it is no longer being charged. The current through the inductor is reducing in magnitude and this will cause a self-induced voltage to develop across the inductor in the opposite direction (e.g., to −12 Volts for 50% duty cycle). This polarity-change across inductor 1306 can be considered as being voluntary (a self-induced voltage rather than a forced voltage from another supply). The current through inductor 1306 continues to flow in the same direction but is now decreasing in magnitude. This current flows through inductor 1306, capacitor 1314 and switch 1324 (which has been turned on). Node 1406 is pulled below ground (e.g., to −12 volts) which also pulls the (−) side of the capacitor 1314 below ground. Node 1404 is at ground potential due to the conducting of switch 1324. From these operations, capacitor 1314 is charged to a potential of 12 V. Additionally, in switch state 3, the inductor 1306 transfers stored energy to capacitor 1314. The average voltage on the capacitor 1314 is therefore 12V with the polarity as shown in the figure. In steady state conditions, at 50% duty cycle, capacitor 1314 can be considered as a voltage source with 12 volts across it. When returning to switch state 1 (shown in FIG. 14), the voltage on node 1406 returns to the level of the power supply 1400 (e.g., battery voltage) since switch 1322 is turned on.

Other operations also occur in switch state 3; for example, inductor 1308 discharges through switch 1324, capacitor 1316, and the load 1402. Since switch 1324 is turned on and conducting, node 1404 is at ground potential and the voltage across inductor 1308 reverses to maintain current flow to capacitor 1316. At a duty cycle of 50%, and based on the need to balance current on the inductor 1308 and balance charge on capacitor 1316, the voltage reversal on the inductor and current flow reversal through the capacitor occur. The average common mode output capacitor 1316 voltage must therefore equate the average coupling capacitor 1314 voltage. The output common-mode voltage is the geometric mean of 24 volts and 0 volts, e.g. 12 volts.

The Zeta power converter 1304 (located on the lower portion of the Zeta amplifier 1300) is driven 180° out of phase relative to the Zeta power converter 1302 (located on the upper portion of the Zeta amplifier 1300). Operating on the complementary cycle of the 50% duty cycle, operations of the Zeta power converter 1304 are similar to the operations of the Zeta power converter 1302 but with an opposite phase.

Figure 15:
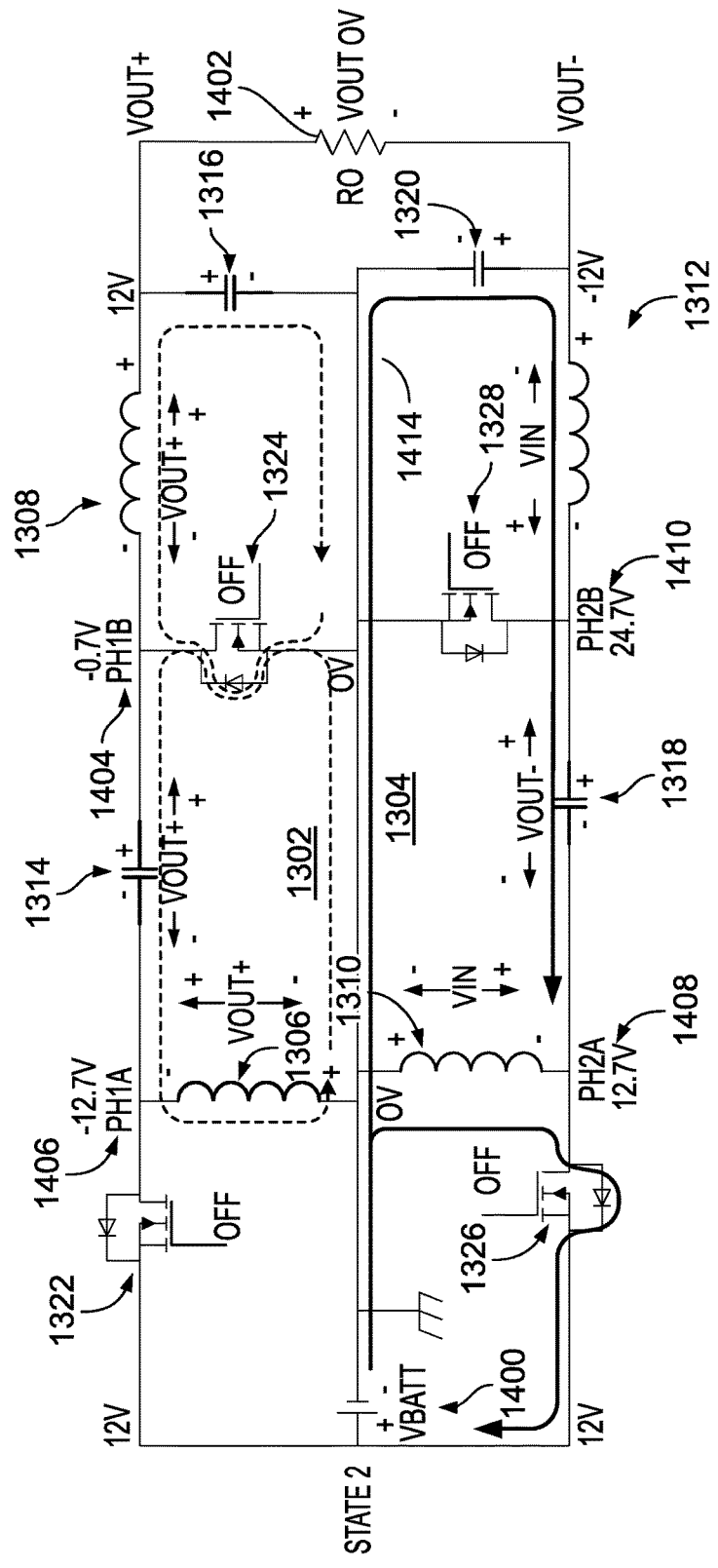

Referring to FIG. 15, the Zeta amplifier 1300 being in switch state 2 is illustrated. In general, switch state 2 represents a transitional dead-time state between switch state 1 and switch state 3. During switch state 2, each of the switches 1322, 1324, 1326, and 1328 are turned off (e.g., for a relatively short period). This switch state avoids current conducting from the power supply 1400 to ground (e.g., shoot-through conduction flowing through coupling capacitor 1314 or 1318) caused by overlapping conduction due to the switches being non-ideal. Also, during switch state 2, the inductors and the capacitor continue to cause current flow even with all switches being turned off. This current may flow through the silicon substrate back-gate diodes of one or more of the FETs depending on the direction of current flow and node voltages from the previous state before turning off the switches. The magnitude and polarity of circuit node voltages during the dead time (state 2) depend on the operating conditions at the time the input and output switches are all being turned off. The node voltages depend on the direction of the instantaneous currents through the inductors, capacitors and switches and whether the ripple currents toggle from positive to negative direction (or vice versa) during a full switching cycle or not. The conditions will also determine whether each switching edge is 'hard' (e.g. a forced switch node current commutation) or soft (e.g. an automatic switch node current commutation).

Considering the 50% duty cycle (shown in FIG. 15), the load current is low enough such that the ripple current in all inductors toggles from a positive to a negative polarity during each switching cycle. Only the positive output side converter 1302 is considered in this description. Upon exiting state 1 and entering state 2, switch 1322 is on/conducting while switch 1324 is off/not conducting. The node 1406 voltage is 12V and node 1404 voltage ~24V given that the capacitor has 12V across it. Current is flowing from the battery 1400 into inductor 1306 and current is flowing through capacitor 1314 and inductor 1308 towards the load. When switch 1322 turns off, the current in inductor 1306 starts reducing in magnitude and the voltage polarity reverses, maintaining the same current flow direction through inductor 1306. The current through switch 1322 automatically commutates towards the capacitor and switch 1324. Switch 1324 now supports the current through its back-gate diode as it was not turned on yet during state 2. As a result, node voltage 1404 will now automatically drop to −0.7V. Node voltage 1406 will automatically drop to −12.7V because the capacitor 1314 acts as a 12V voltage source. The output capacitances of switches 1322 is charged and 1324 is also discharged automatically through this current commutation process. The switch action does not introduce current spikes as a result and the switch action is considered "soft". Turning on switch 1324 in state 3 (FIG. 16) changes little to the state of the circuit other than enhancing switch 1324 fully, thereby removing the final 0.7 V voltage drop across it.

Figure 17:
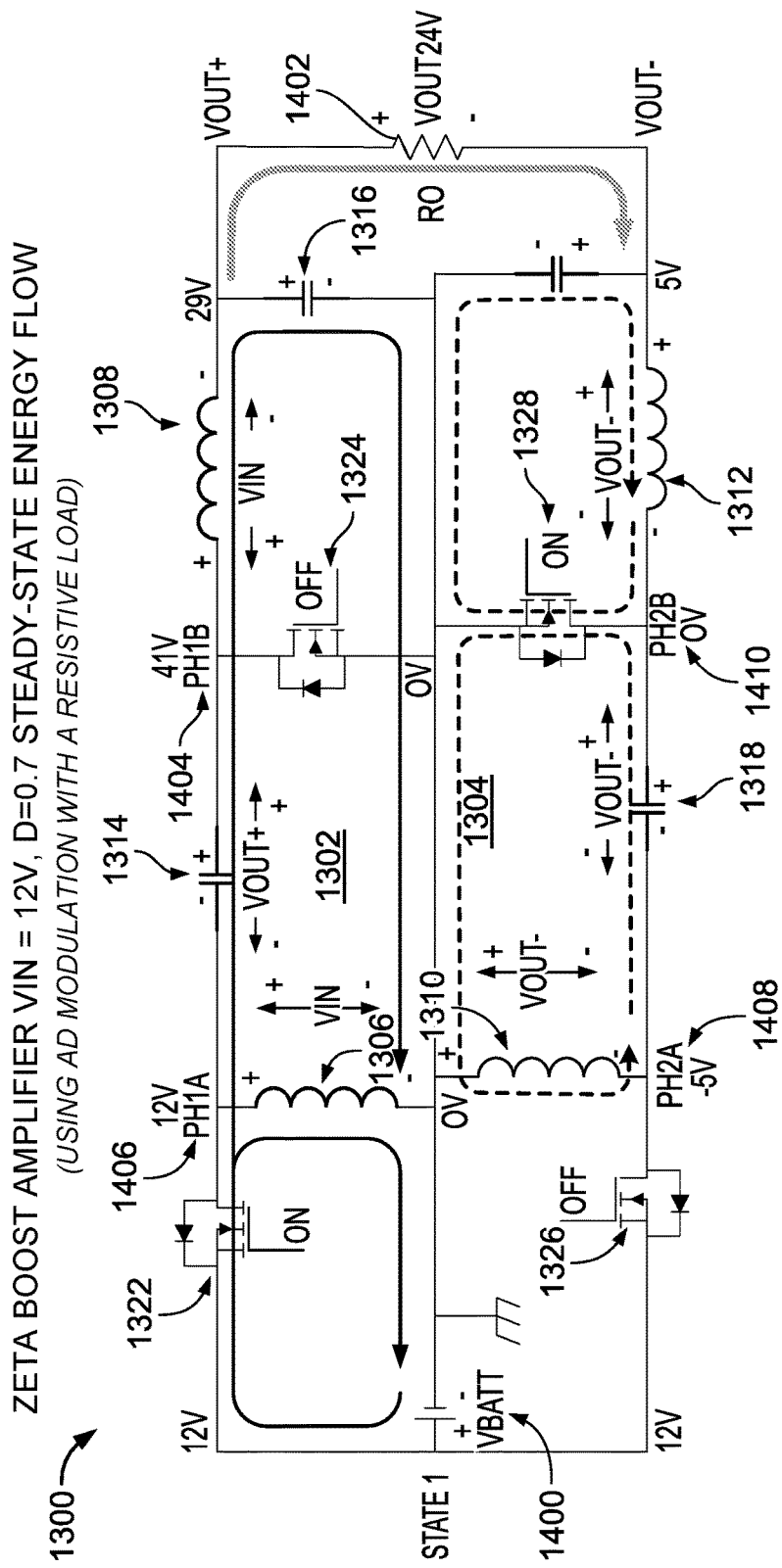
FIGS. 17-19 illustrate states of a Zeta converter based self-boosting push pull amplifier operating with a larger than 50% duty cycle.
Figure 18:
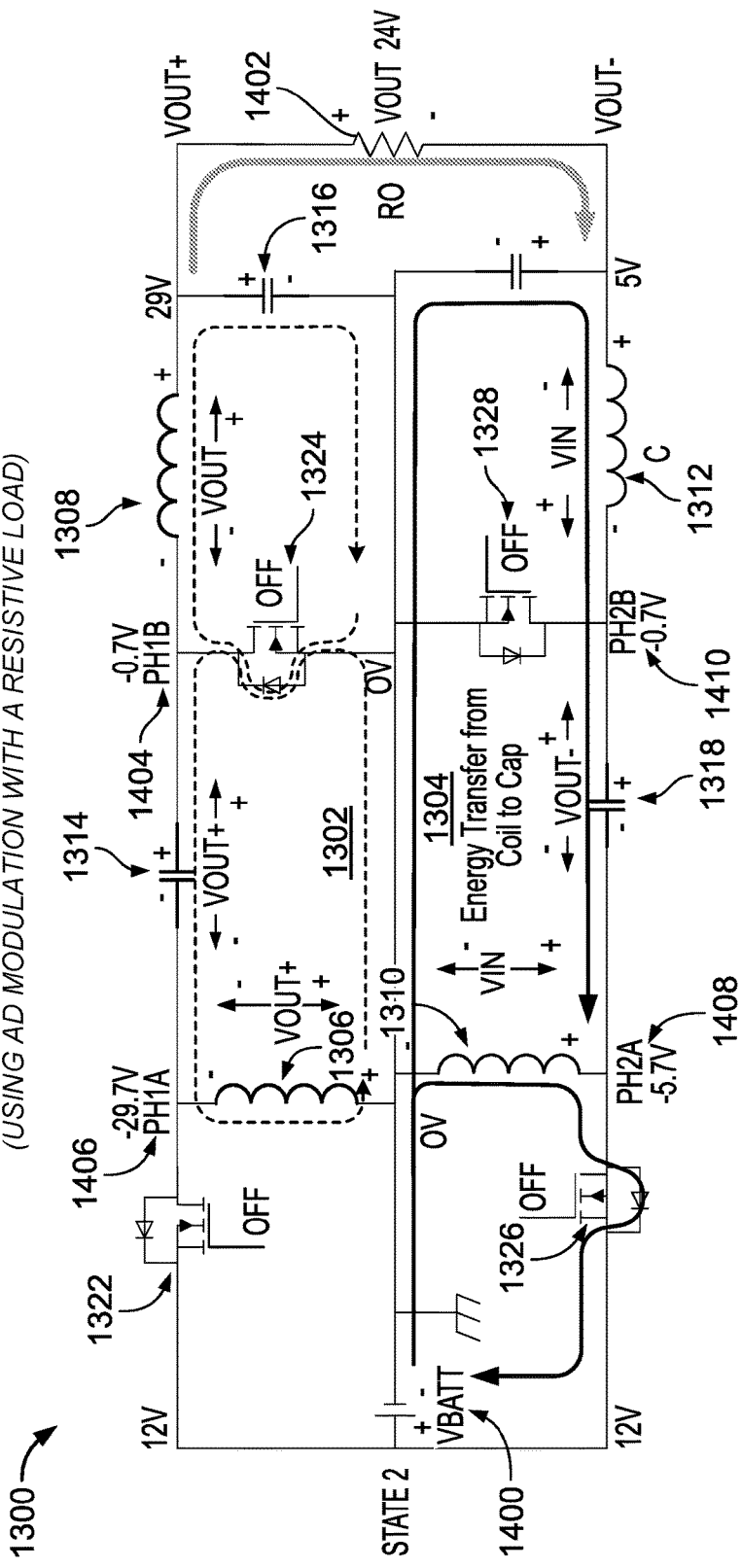

Referring to FIG. 18, another example is illustrated with different starting conditions. In particular, the duty cycle is now at 70%. The average load current is towards the load. In this case, the current ripple in both the positive side Zeta converter inductors 1306 and 1308 is now strictly positive in polarity over the whole switching cycle. Only the positive output side converter 1302 is considered in this description. Upon exiting state 3 (FIG. 19) and entering state 2 (FIG. 18), switch 1322 is off/not-conducting while switch 1324 is was on/conducting. The node 1406 voltage is at −29 V and node 1404 voltage is at 0 V given that the capacitor has 29V across it. Current is not flowing from the battery 1400 to converter 1302. Current is flowing through switch 1324 and inductor 1308 towards the load but decreasing in magnitude. When switch 1324 also turns off in state 2, the current in inductor 1306 continues to reduce in magnitude and the voltage polarity across inductor 1306 stays reversed, maintaining the same current flow direction through inductor 1306. This current is now pulled through the back-gate diode of switch 1324, which drops the node voltages at 1404 and 1406 an additional 0.7 V. Moving on from here to state 1 (FIG. 17), When switch 1322 is turned on, the current through inductor 1306 commutates towards the switch. Only then can node voltage 1406 changes from −29.7 V to 12 V. This sudden discharged of the output capacitance from −29.7 V to 12 V while the switch is turning on introduces a large current spike. The switch action is considered 'hard'. High switch loss is observed as the current commutation is now 'forced' e.g. not automatic. This condition is now different from the previous example due to different operating conditions. Furthermore, the voltage on node 1404 rises to 41 V as the capacitor acts as a voltage source that stacks upon the voltage at node 1404 when switch 1322 is fully on. Switch 1324 remains off and is not conducting any current. Switch 1324 output capacitance is charged from 0 V to 41 V and introduces a current spike as well. The switch action is not automatic and considered 'hard' involving high loss.

The previous two examples cover a few of the possible operating conditions of the zeta amplifier during dead-time state 2. More examples are possible, and each operating condition needs to be carefully considered for its discourse.

Figure 19:
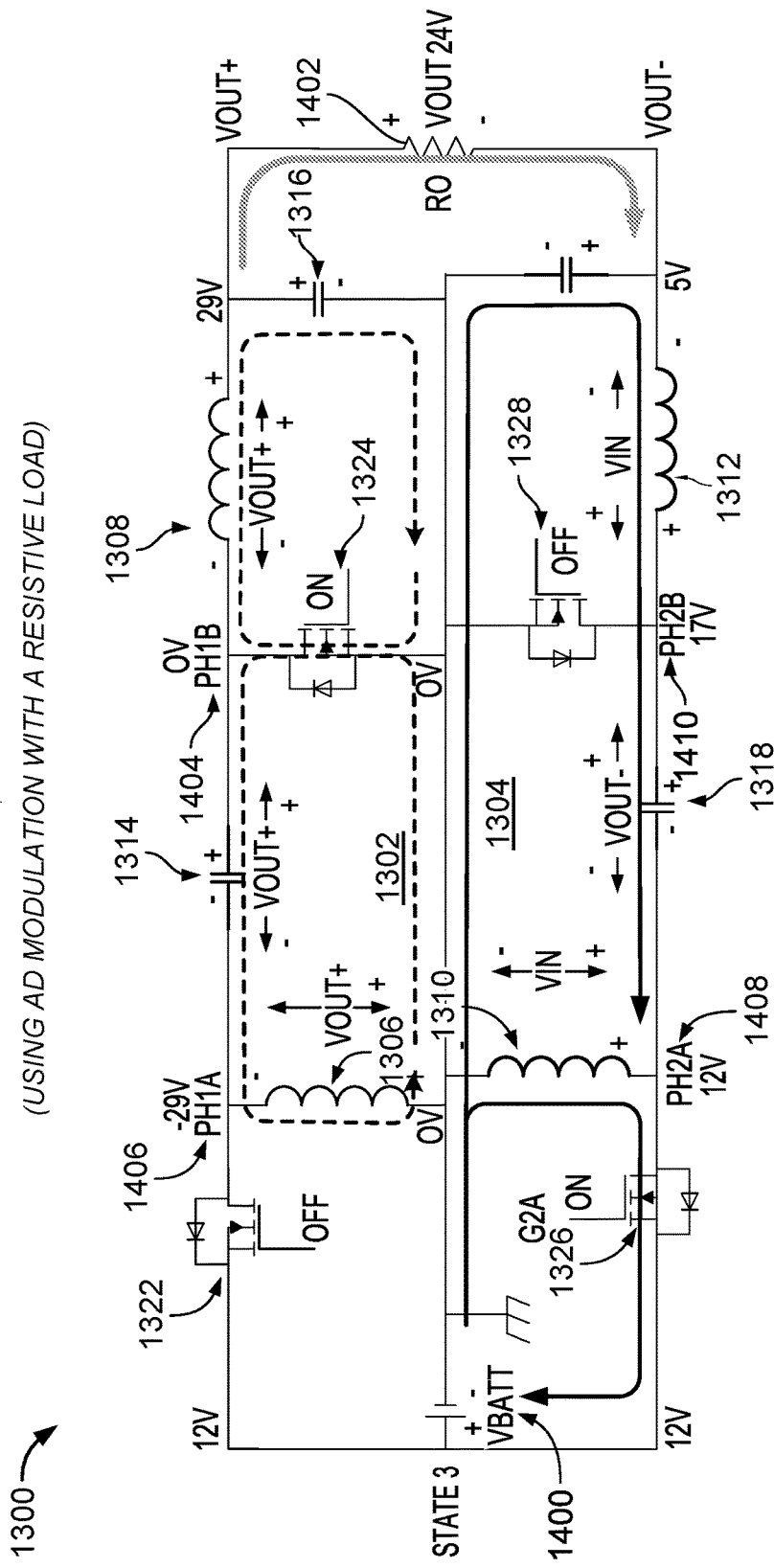

Referring to FIGS. 17-19, the Zeta amplifier 1300 may be operated with other duty cycles. For example, when Zeta amplifier 1300 is set with a duty cycle of approximately 70%, the output assumes a 24 volt differential voltage with a positive polarity, which is twice the 12 volts value of the power supply 1400. Such an increase demonstrates the self-boosting ability of the Zeta amplifier 1300. Through the use of flux (volt-second) balance of the inductors and the charge balance of the capacitors as energy storing elements, the steady-state conditions can be quantified.

Referring to FIG. 17, switch state 1 of the Zeta amplifier 1300 is illustrated. Similar to 50% duty cycle case (shown in FIG. 14), inductor 1306 is charged with the available voltage of the power supply 1400 (e.g., the 12 volt battery). Due to the duty cycle of switch 1322 now being 70%, additional time is provided to the current of the inductor 1306 to ramp to a larger level thus adding more energy. When switch 1322 is turned off, maintaining volt-second balance, the discharge of the inductor 1306 generally occurs faster, which produces 29 volts across inductor 1306 based on geometric considerations of the dI/dt in the charge and discharge state of this inductor.

Referring to FIG. 19, for state 3, based on the voltage across inductor 1306, capacitor 1314 charges to 29 volts since switch 1324 connects the load side of capacitor 1314 to ground. Further, since inductor 1308 is charged for the same amount of time as inductor 1306 and the need for volt-second balance in steady-state conditions, the voltage across inductor 1308 is equivalent to the voltage across the inductor 1306 (if both inductors 1306 and 1308 have equivalent inductance values). Based on the determined values, voltages at the nodes of the Zeta power converter 1302 can be determined. A similar approach can be used for the Zeta power converter 1304 (illustrated in the bottom half of the Zeta amplifier 1300).

Figure 20:
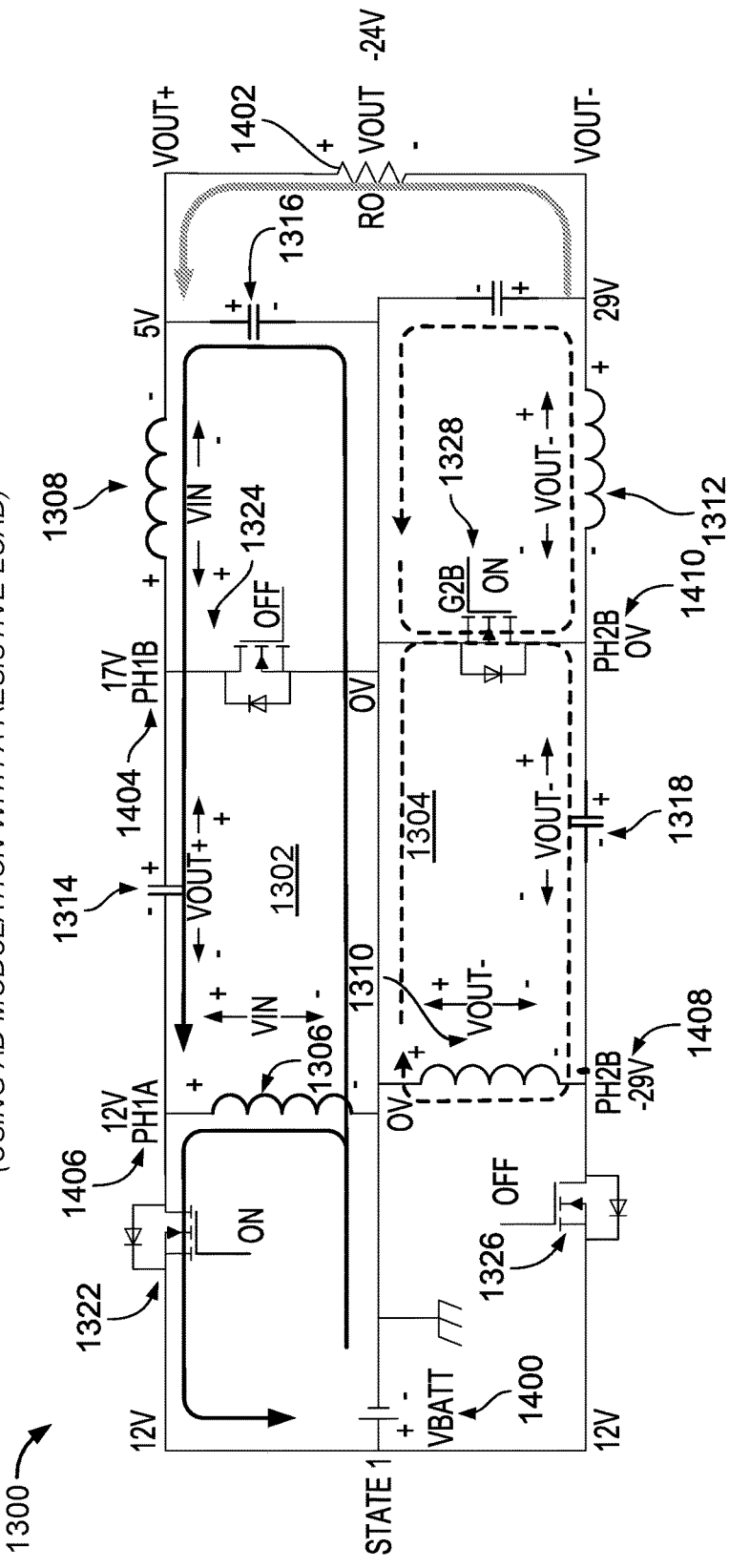
FIGS. 20-22 illustrate states of a Zeta converter based self-boosting push pull amplifier operating with a less than 50% duty cycle.
Figure 21:
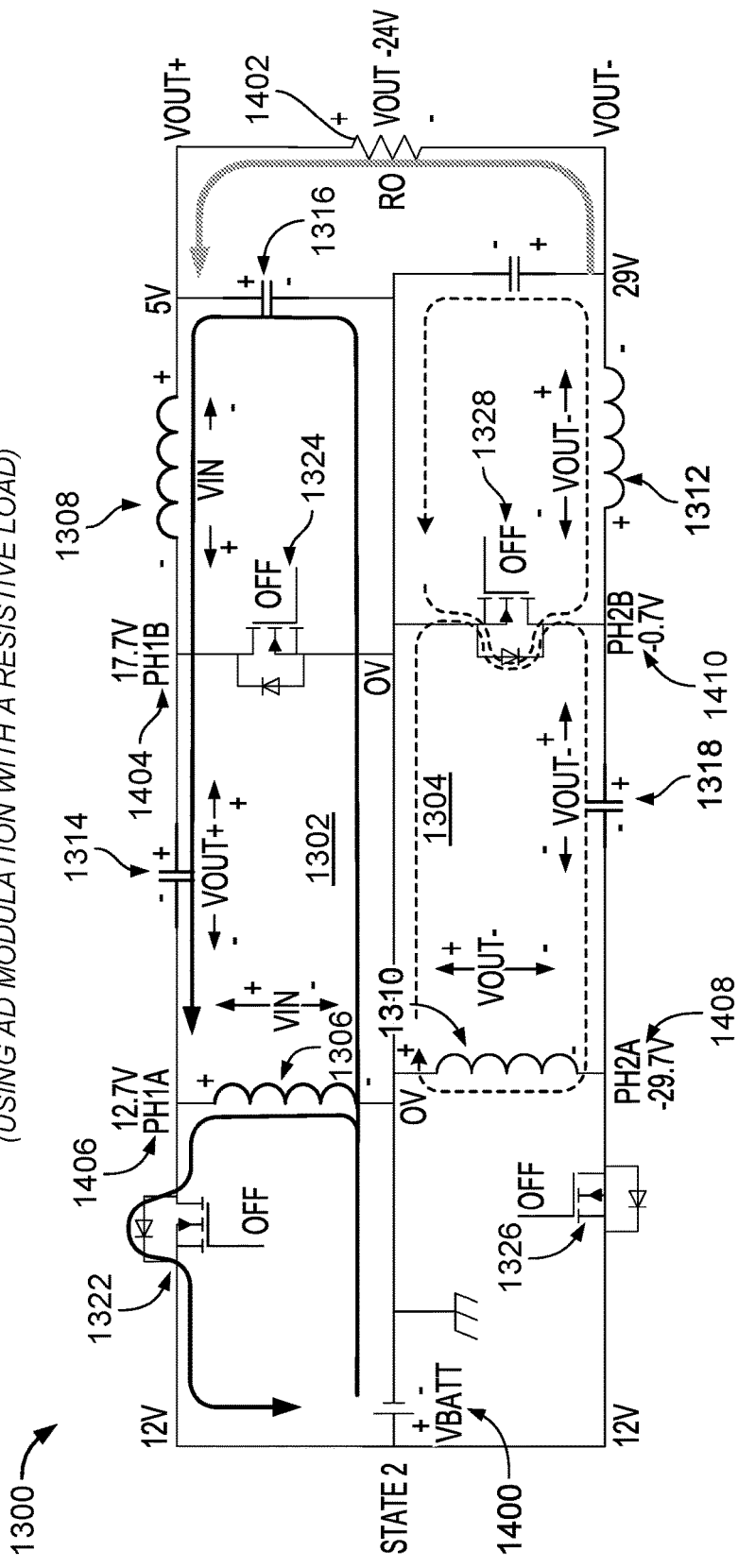
Figure 22:
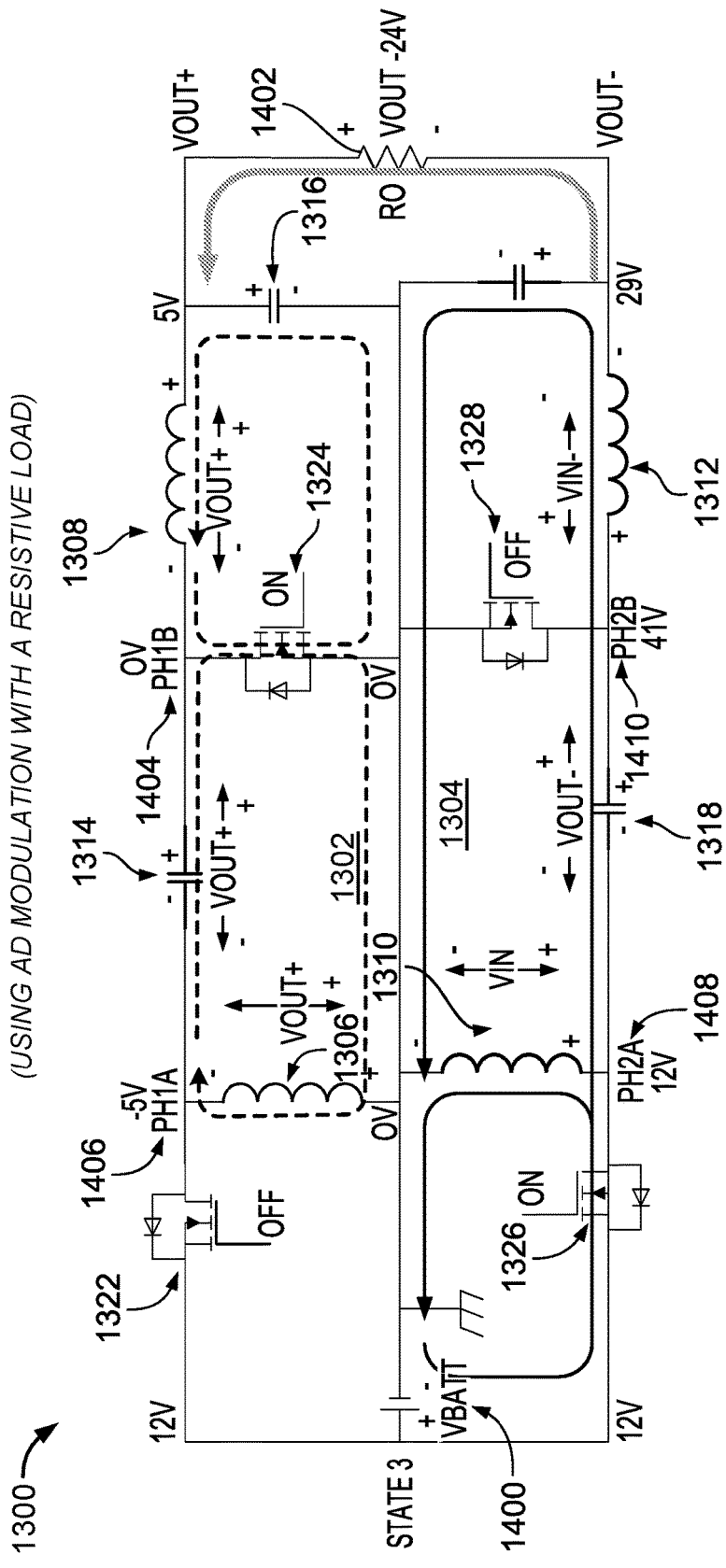

Referring to FIG. 20-22 the three switch states are illustrated for the Zeta amplifier 1300 operating at a duty cycle of 30% (a gain of −2). Operations of the Zeta power converters 1302 and 1304 are similar to the operations of the power converters shown in FIGS. 17-19 operating with a 70% duty cycle. The ability to soft switch is maintained until the DC current in combination with ripple through inductor 1310 becomes positive. Turning on switch 1326 now forces the inductor 1310 to switch polarity rather than it being facilitated by the polarity reversal of the current traversing though zero. At this point increased switching losses are experienced due to voltage stress across the switch 1326 and the sudden discharging of the output capacitance of switch 1326 while simultaneously charging the output capacitance of switch 1328.

Figure 23:
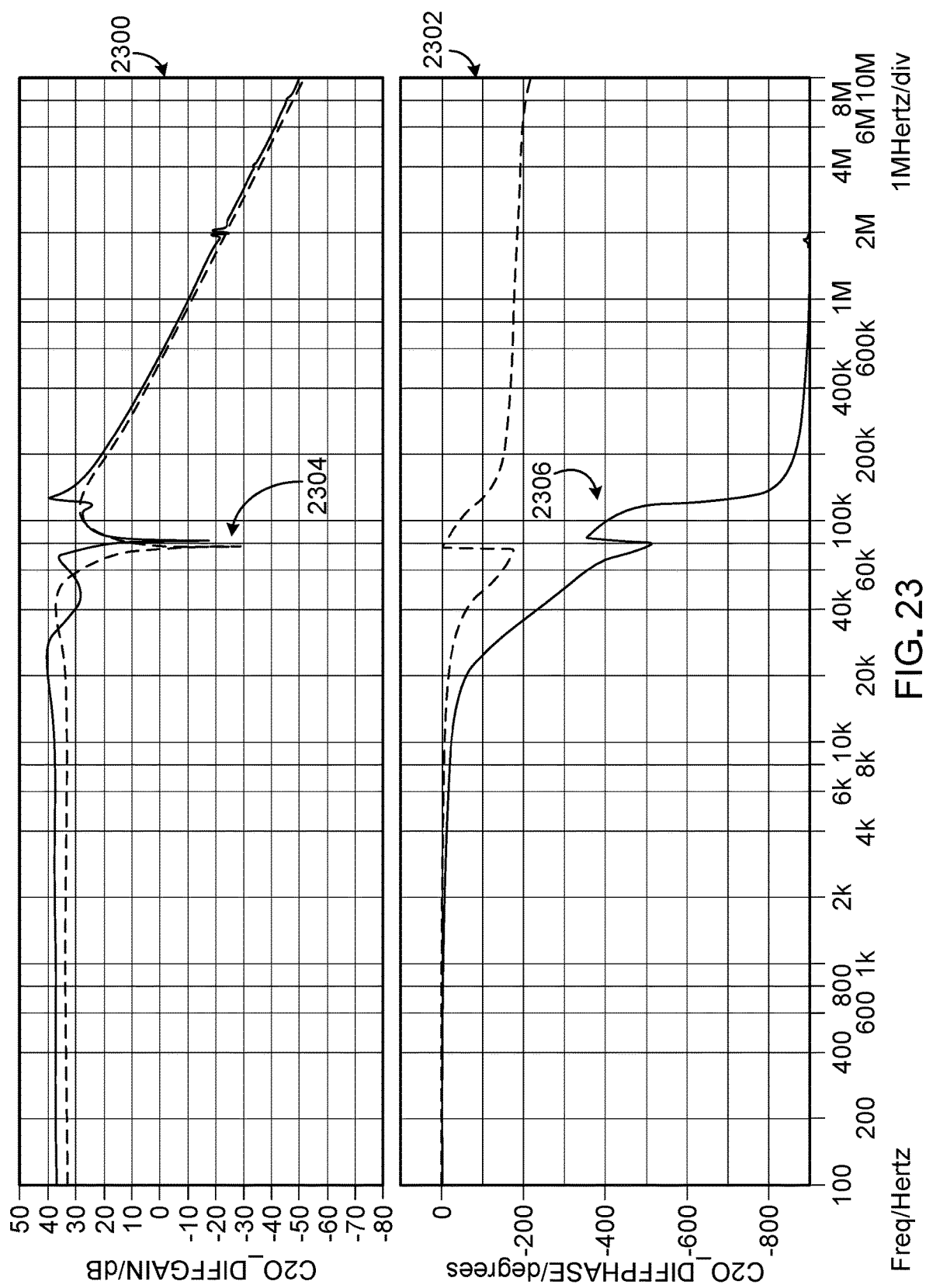
FIG. 23 are control to output differential magnitude and phase response plots of a Zeta amplifier with a 30%, 50%, and 70% duty cycle.

Referring to FIG. 23, two charts 2300 and 2302 are shown that present the small signal frequency response of the Zeta amplifier 1300. In particular, the magnitude of the control to output differential response of the amplifier is provided by chart 2300 and the control to output differential phase response is provided by chart 2302 In general, the responses (in particular the phase response) report steep features and peaky behavior. In the phase response, shown in chart 2303, a 900° phase shift is experienced at higher frequencies (e.g., around 100,000 Hz). Compared with the responses of a buck derived converter, one or more of the poles and zeros may change position with varying duty cycle. Compensation may be provided by one or more techniques. For example, a digital compensator can be incorporated (e.g., into a controller such as controller 1210 shown in FIG. 12) to dynamically track the poles and zeros to provide compensation and to improve bandwidth.

Features of the magnitude and phase responses (as highlighted by arrows 2304 and 2306) can be clustered and pushed out to higher frequencies beyond the audio band to make sure they don't affect the frequency response negatively. For example, the features can be positioned at the edge of the 20-30 kHz audio bandwidth for providing a relatively flat loop gain in the audio band. Features may be pushed out even further beyond the unity gain open loop bandwidth to avoid compensation of some poles and zeros all together. For example: the deep nulls in the response or right half plane poles.

Figure 24:
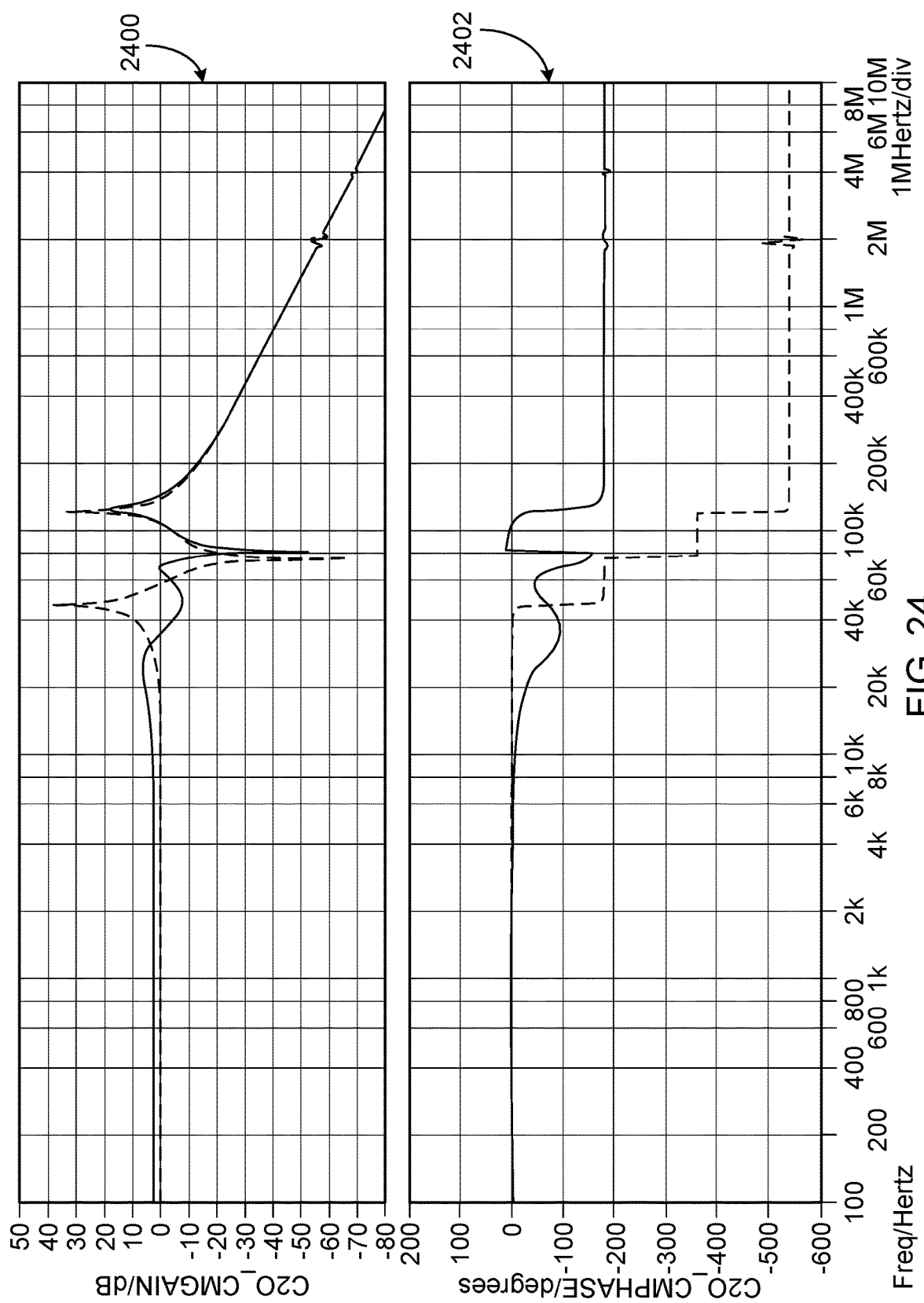
FIG. 24 are supply to output differential magnitude and phase response plots of the Zeta ampler with a 30%, 50%, and 70% duty cycle.

FIG. 24 shows the common mode supply to output response of the Zeta amplifier (i.e., magnitude chart 2400 and phase chart 2402). It should be noted that the common mode response represents the PSRR (power supply rejection ratio) of the Zeta amplifier. The small-signal gain in the audio band frequencies is higher than for the buck derived class-D amplifier. This results in lower PSRR due to the positive and negative outputs varying asymmetrically with varying duty cycle. The features in the supply to output response are closely related to the features found in the control to output response. When the features are moved and changed through component value manipulations in the control to output response, the features in the supply to output will also be manipulated in like manner. Chart 2400 shows the peaky behavior that is observed in the Zeta amplifier's supply to output response. These peaks can be damped through the use of current feedback techniques.

Figure 25:
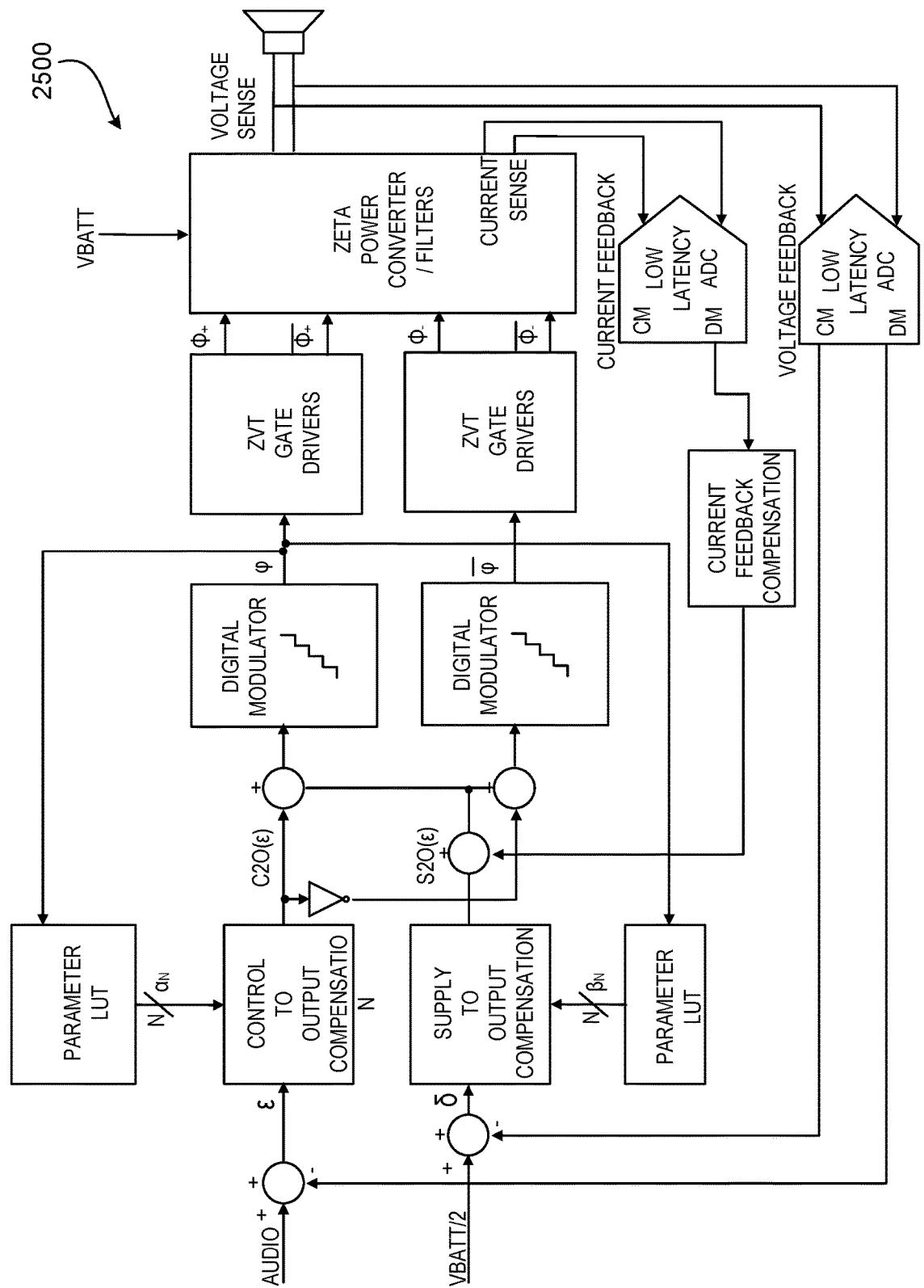
FIG. 25 is a block diagram of a Zeta converter based on self-boosting push pull amplifier including voltage and current feedback.

Current feedback techniques may be used to synthesize resistances that will suppress high-Q resonances and associated sharp phase changes in the converter stages of the of the Zeta amplifier. These resonances and phase changes may become a challenge to closing the control loop with a voltage feedback compensator only in a stable manner. A possible implementation is shown in FIG. 25. Block diagram 2500 as shown in FIG. 12A however an additional current feedback loop is added. The current sensor measures the current through a component somewhere in the converter. The current feedback signal is compensated with a loop filter before it is summed into the modulator control input. The overall effect of this is that a synthetic resistance is added in series with the current sensed component which has a damping effect on any resonances inside the circuit. However, because the resistance is synthesized and not real, it generally does not generate any DC losses detrimental to the overall conversion efficiency. Typically, the current feedback signal is subtracted out of the input signal resulting in a loss of gain however, due to the boosting nature of the Zeta amplifier, this can be corrected for with an increased duty cycle range. More than one current sensing point may be used and be combined into one or more feedback signals. These feedback signals may sum into the modulator control input in differential mode and/or common mode sense.

To implement the design of the Zeta amplifier 1300, one or more techniques may be employed. For example, the design can be realized through a silicon (Si) diffusion process; however, other processes such as gallium-nitride (GaN) processes can be employed to use the benefits associated with GaN, being low $R_{DS(ON)}$ and low gate capacitance, and producing high speed operational devices. The output capacitance of a planar GaN HEMT is generally substantially higher than an equivalent vertical Si MOSFET. However, in a resonant design solution, the capacitance can be used to establish resonance and reduce the associated switching loss by establishing zero-voltage transition (ZVT) conditions.

Boost converter stages such as the Zeta power converters 1302, 1304 are non-linear, and negative feedback can be employed to linearize the design for acceptable performance over the audio band. High loop gain across the audio band can be used to correct of the non-linear behavior.

A number of implementations have been described. However, other implementations not specifically described in details may also be within the scope of the following claims.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:
1. An apparatus comprising:
an amplifier comprising:
a first Zeta converter connected to a power supply and a load;
a second Zeta converter connected to the power supply and the load, the second Zeta converter being driven by a complementary duty cycle relative to the first Zeta converter; and
a controller to provide an audio signal to the first Zeta converter and the second Zeta converter for delivery to the load, wherein the controller is connected to the load to receive a voltage feedback signal, and wherein the controller is connected to a component of at least one of the first Zeta converter and the second Zeta converter to receive a current feedback signal.

2. The apparatus of claim 1, wherein the amplifier is a class-D amplifier.

3. The apparatus of claim 1, wherein both the first Zeta converter and the second Zeta converter are fourth order converters.

4. The apparatus of claim 1, wherein both the first Zeta converter and the second Zeta converter employ a Zero Voltage Transition (ZVT) switching technique.

5. The apparatus of claim 1, wherein each of the first Zeta converter and the second Zeta converter include an inductor directly connected to ground and a switch directly connected to the power supply.

6. The apparatus of claim 1, wherein each of the first Zeta converter and the second Zeta converter use integrated magnetics to couple inductors.

7. The apparatus of claim 1, wherein the controller is configured to initiate moving one or more poles and zeros to positions external to an operating frequency range of the amplifier.

8. The apparatus of claim 1, wherein the load is at least one speaker.

9. The apparatus of claim 1, wherein the voltage feedback signal comprises a common-mode correction signal.

10. The apparatus of claim 9, wherein the common-mode correction signal is input to a compensator with a supply voltage reference signal.

11. The apparatus of claim 9, wherein the differential-mode correction signal is input to a compensator with the audio signal.

12. The apparatus of claim 1, wherein the voltage feedback signal comprises a differential-mode correction signal.

13. The apparatus of claim 1, wherein the current feedback signal is compensated with a loop filter before being summed into a modulator control input.

14. The apparatus of claim 13, wherein the compensated current feedback signal is summed with a compensated audio signal.

15. The apparatus of claim 13, wherein the compensated current feedback signal is summed with a compensated supply reference signal.

16. An amplifier comprising:
a power stage comprising:
a first Zeta converter connectable to a power supply and a load;
a second Zeta converter connectable to the power supply and the load, the second Zeta converter being driven by a complementary duty cycle relative to the first Zeta converter; and
a controller to provide an audio signal to the first Zeta converter and the second Zeta converter for delivery to the load,
wherein the controller is configured to initiate moving the one or more poles and zeros to positions external to an operating frequency range of the amplifier, and
wherein the controller is connected to the load to receive a voltage feedback signal, and wherein the controller is connected to a component of at least one of the first Zeta converter and the second Zeta converter to receive a current feedback signal.

17. The amplifier of claim 16, wherein the amplifier is a class-D amplifier.

18. The amplifier of claim 16, wherein both the first Zeta converter and the Zeta converter are fourth order converters.

19. The amplifier of claim 16, wherein each of the first Zeta converter and the second Zeta converter include an inductor directly connected to ground and a switch directly connected to the power supply.

20. The amplifier of claim 16, wherein each of the first Zeta converter stage and the Zeta converter stage use integrated magnetics to couple inductors.

21. The amplifier of claim 16, wherein both the first Zeta converter and the second Zeta converter employ a Zero Voltage Transition (ZVT) switching technique.

22. The amplifier of claim 16, wherein the load is at least one speaker.

23. An apparatus comprising:
an amplifier comprising:
a first Zeta converter connected to a power supply and a load;
a second Zeta converter connected to the power supply and the load, the second Zeta converter being driven by a complementary duty cycle relative to the first Zeta converter; and
a controller to provide an audio signal to the first Zeta converter and the second Zeta converter for delivery to the load, wherein the controller is connected to the load to receive a voltage feedback signal and a current feedback signal,
wherein the voltage feedback signal comprises a differential-mode correction signal.

24. The apparatus of claim 23, wherein the amplifier is a class-D amplifier.

25. The apparatus of claim 23, wherein both the first Zeta converter and the second Zeta converter employ a Zero Voltage Transition (ZVT) switching technique.

26. The apparatus of claim 23, wherein the load comprises at least one speaker.

27. An apparatus comprising:
an amplifier comprising:
a first Zeta converter connected to a power supply and a load;
a second Zeta converter connected to the power supply and the load, the second Zeta converter being driven by a complementary duty cycle relative to the first Zeta converter; and
a controller to provide an audio signal to the first Zeta converter and the second Zeta converter for delivery to the load, wherein the controller is connected to the load to receive a voltage feedback signal and a current feedback signal,
wherein the current feedback signal is compensated with a loop filter before being summed into a modulator control input.

28. The apparatus of claim 27, wherein the amplifier is a class-D amplifier.

29. The apparatus of claim 27, wherein both the first Zeta converter and the second Zeta converter employ a Zero Voltage Transition (ZVT) switching technique.

30. The apparatus of claim 27, wherein the load comprises at least one speaker.

* * * * *